United States Patent [19]

Nolan et al.

[11] Patent Number: 5,760,720

[45] Date of Patent: Jun. 2, 1998

[54] DIGITAL TRIMMING OF ON-CHIP ANALOG COMPONENTS

[75] Inventors: James B. Nolan; Hung Q. Nguyen, both of Chandler; Brian Dellacroce, Sedona, all of Ariz.

[73] Assignee: Microchip Technology Incorporated, Chandler, Ariz.

[21] Appl. No.: 929,398

[22] Filed: Sep. 15, 1997

Related U.S. Application Data

[63] Continuation of Ser. No. 526,529, Sep. 11, 1995, abandoned.

[51] Int. Cl.$^6$ ........................................ H03M 1/10
[52] U.S. Cl. ................................. 341/120; 341/121
[58] Field of Search ............................. 341/118, 119, 341/120, 121

[56] References Cited

U.S. PATENT DOCUMENTS 5,121,118  6/1992  Hermann ........................... 341/118
5,396,241  3/1995  Ames et al. ........................ 341/118
5,453,749  9/1995  Morita ............................... 341/118

*Primary Examiner*—Marc S. Hoff
*Attorney, Agent, or Firm*—Wigman, Cohen, Leitner & Myers P.C.

[57] ABSTRACT

A microcontroller for use in battery charging and monitoring applications is disclosed. The microcontroller includes a microprocessor and various front-end analog circuitry such as a slope A/D converter and a multiplexer for allowing a plurality of analog input signals to be converted to corresponding digital counts indicative of signal level. In order to make the measurements of the selected analog inputs more precise, the microcontroller uses a unique calibration procedure whereby selected parameters associated with the analog circuitry that are subject to variation are measured during test and corresponding calibration constants are calculated therefrom and stored in program memory. These stored calibration constants are subsequently used by the microprocessor in conjunction with the digital counts of the analog input signals for calculating a more precise measurement of the analog input signals.

18 Claims, 16 Drawing Sheets

FIG. 2
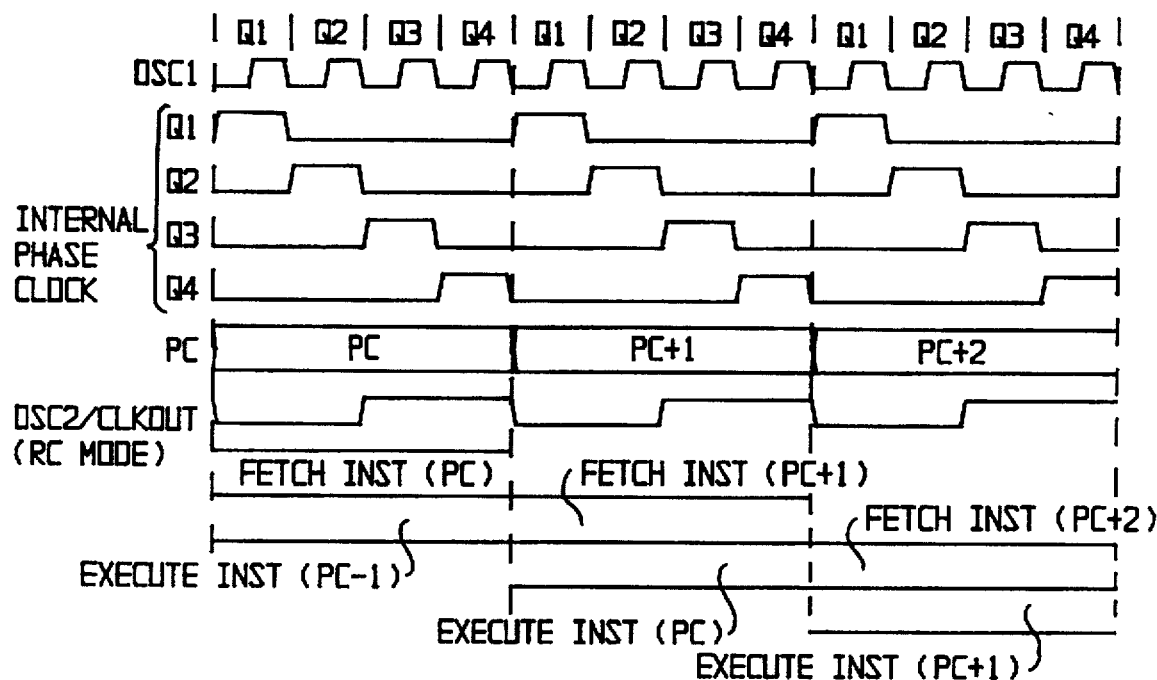
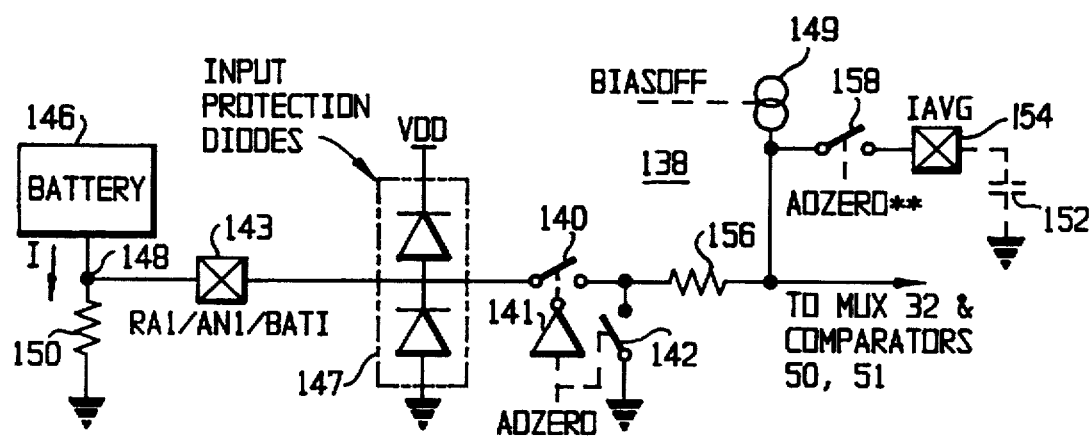
FIG. 7

| PARAMETER | SYM. | UNITS | MIN/MAX | ADD. | FORMAT |
|---|---|---|---|---|---|
| SLOPE REFERENCE | $K_{ref}$ | UNIT-LESS RATIO | 0.1/ 0.15 | 0FC0 h - 0FC3 h | 32-BIT FLOATING POINT* |
| BANDGAP REFERENCE VOLTAGE | $K_{bg}$ | VOLTS | 1.0/ 1.5 | 0FC4 h - 0FC7 h | 32-BIT FLOATING POINT |
| TEMPERATURE SENSOR VOLTAGE @ TBD DEGREES | $V_{thrm}$ | VOLTS | 0.0/ 1.0 | 0FC8 h - 0FCB h | 32-BIT FLOATING POINT |
| TEMPERATURE SENSOR VOLTAGE COEFFICIENT | $K_{tc}$ | VOLTS/ DEGREE CELSIUS | 0.001/ 0.0010 | 0FCC h - 0FCF h | 32-BIT FLOATING POINT |
| INTERNAL MAIN OSCILLATOR FREQUENCY | $F_{osc}$ | X* 10KHz +3.0M Hz | | 0FD0 h | BYTE |
| WDT FREQUENCY (OPTIONAL) | $F_{wdt}$ | Hz | 25-200 | 0FD2 h | BYTE |

FIG. 4

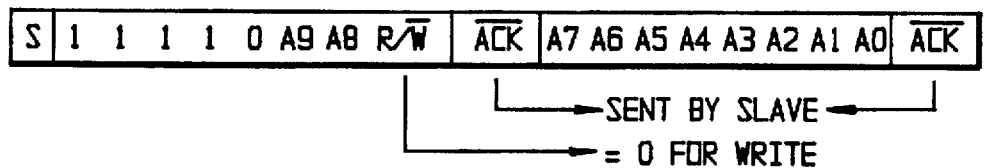

S = START CONDITION
R/$\overline{W}$ = READ/WRITE PULSE
ACK = ACKNOWLEDGE

FIG. 15

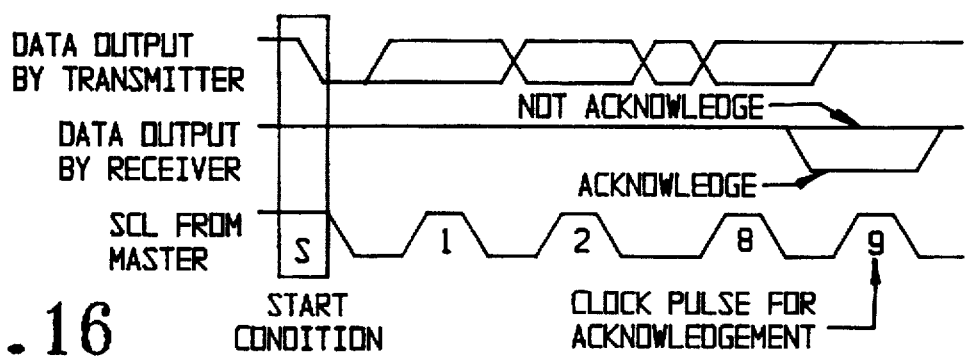

| CONV # | $t_{rel}$ | $t_{abs}$ | INTERLEAVE CHANNEL | A/D CHANNEL |
|---|---|---|---|---|
| 0 | 16 mS | mS | RUN SEQUENCE ON CURRENT INPUT CHANNEL | $BatI_{in}$ |
| 1 | 16 mS | mS | RUN SEQUENCE ON Vrefhi CHANNEL | $V_{refhi}$ |
| 2 | 16 mS | mS | RUN SEQUENCE ON CURRENT INPUT CHANNEL | $BatI_{in}$ |
| 3 | 16 mS | mS | RUN SEQUENCE ON Vreflo CHANNEL | $V_{reflo}$ |
| 4 | 16 mS | mS | RUN SEQUENCE ON CURRENT INPUT CHANNEL | $BatI_{in}$ |
| 5 | 16 mS | mS | RUN SEQUENCE ON BANDGAP CHANNEL | $V_{bg}$ |
| 6 | 16 mS | mS | RUN SEQUENCE ON CURRENT INPUT CHANNEL | $BatI_{in}$ |
| 7 | 16 mS | mS | RUN SEQUENCE ON $V_{in}$ CHANNEL | $VBat_{in}$ |
| 8 | 16 mS | mS | RUN SEQUENCE ON CURRENT INPUT CHANNEL | $BatI_{in}$ |
| 9 | 16 mS | mS | RUN SEQUENCE ON CURRENT ZERO CHANNEL | $I_{zero}$ |
| 10 | 16 mS | mS | RUN SEQUENCE ON CURRENT INPUT CHANNEL | $BatI_{in}$ |
| 11 | 16 mS | mS | RUN SEQUENCE ON THERMISTOR CHANNEL | $T_{int}$ |
| 12 | 16 mS | mS | RUN SEQUENCE ON CURRENT INPUT CHANNEL | $BatI_{in}$ |
| 13 | 16 mS | mS | RUN SEQUENCE ON EXTERNAL THERMISTOR CHANNEL | $T_{ext}$ |
| 14 | 16 mS | mS | RUN SEQUENCE ON CURRENT INPUT CHANNEL | $BatI_{in}$ |
| 15 | 16 mS | mS | RUN SEQUENCE ON $V_{in}$ CHANNEL | $BatV_{in}$ |

S = START CONDITION
R/W = READ/WRITE PULSE
ACK = ACKNOWLEDGE

| LDACx<7:3> | | | | | NOMINAL OUTPUT VOLTAGE RANGE (V) | SENSE CURRENT RANGE (WITH 0.05 ohm SENSE RESISTOR)-mA |
|---|---|---|---|---|---|---|
| 0 | 0 | 0 | 0 | 0 | 0.5000-0.5050 | 0-100 |
| 0 | 0 | 0 | 0 | 1 | 0.5050-0.5100 | 100-200 |
| 0 | 0 | 0 | 1 | 0 | 0.5100-0.5150 | 200-300 |
| 0 | 0 | 0 | 1 | 1 | 0.5150-0.5200 | 300-400 |
| 0 | 0 | 1 | 0 | 0 | 0.5200-0.5250 | 400-500 |
| 0 | 0 | 1 | 0 | 1 | 0.5250-0.5300 | 500-600 |
| 0 | 0 | 1 | 1 | 0 | 0.5300-0.5350 | 600-700 |
| 0 | 0 | 1 | 1 | 1 | 0.5350-0.5400 | 700-800 |
| 0 | 1 | 0 | 0 | 0 | 0.5400-0.5450 | 800-900 |
| 0 | 1 | 0 | 0 | 1 | 0.5450-0.5500 | 900-1000 |
| 0 | 1 | 0 | 1 | 0 | 0.5500-0.6000 | 1000-2000 |
| 0 | 1 | 0 | 1 | 1 | 0.6000-0.6500 | 2000-3000 |
| 0 | 1 | 1 | 0 | 0 | 0.6500-0.7000 | 3000-4000 |
| 0 | 1 | 1 | 0 | 1 | 0.7000-0.7500 | 4000-5000 |
| 0 | 1 | 1 | 1 | 0 | 0.7500-0.8000 | 5000-6000 |
| 0 | 1 | 1 | 1 | 1 | 0.8000-0.8500 | 6000-7000 |
| 1 | 0 | 0 | 0 | 0 | 0.4950-0.5000 | 0-(100) |
| 1 | 0 | 0 | 0 | 1 | 0.4900-0.4950 | (100)-(200) |
| 1 | 0 | 0 | 1 | 0 | 0.4850-0.4900 | (200)-(300) |
| 1 | 0 | 0 | 1 | 1 | 0.4800-0.4850 | (300)-(400) |
| 1 | 0 | 1 | 0 | 0 | 0.4750-0.4800 | (400)-(500) |
| 1 | 0 | 1 | 0 | 1 | 0.4700-0.4750 | (500)-(600) |
| 1 | 0 | 1 | 1 | 0 | 0.4650-0.4700 | (600)-(700) |
| 1 | 0 | 1 | 1 | 1 | 0.4600-0.4650 | (700)-(800) |
| 1 | 1 | 0 | 0 | 0 | 0.4550-0.4600 | (800)-(900) |
| 1 | 1 | 0 | 0 | 1 | 0.4500-0.4550 | (900)-(1000) |
| 1 | 1 | 0 | 1 | 0 | 0.4000-0.4500 | (1000)-(2000) |
| 1 | 1 | 0 | 1 | 1 | 0.3500-0.4000 | (2000)-(3000) |
| 1 | 1 | 1 | 0 | 0 | 0.3000-0.3500 | (3000)-(4000) |
| 1 | 1 | 1 | 0 | 1 | 0.2500-0.3000 | (4000)-(5000) |
| 1 | 1 | 1 | 1 | 0 | 0.2000-0.2500 | (5000)-(6000) |
| 1 | 1 | 1 | 1 | 1 | 0.1500-0.2000 | (6000)-(7000) |

FIG. 9

| 90h | B7 | B6 | B5 | B4 | B3 | B2 | B1 | B0 |
|---|---|---|---|---|---|---|---|---|
| CHGCON | U | CCOMPB | R | CPOLB | U | CCOMPA | CCAEN | CPOLA |
| READ/WRITE | - | R | R/W | R/W | - | R | R/W | R/W |
| POR VALUE 00h | 0 | 0 | 0 | 0 | 0 | 0 | 0 | 0 |

| Bit | Name | Description |
|---|---|---|
| B7 | - | UNIMPLEMENTED. READ AS '0'. |
| B6 | CCOMPB | CHARGE CONTROL COMPARATOR OUTPUT B. READING THIS BIT RETURNS THE STATUS OF THE CHARGE CONTROL/WAKE-UP COMPARATOR B OUTPUT. WRITES TO THIS BIT HAVE NO EFFECT. |
| B5 | R | RESERVED. THIS BIT SHOULD BE PROGRAMMED AS '0'. USE OF THIS BIT AS A GENERAL PURPOSE READ/WRITE BIT IS NOT RECOMMENDED, SINCE THIS MAY AFFECT UPWARD COMPATIBILITY WITH FUTURE PRODUCTS. |
| B4 | CPOLB | CHARGE CONTROL POLARITY BIT B<br>1=INVERT THE OUTPUT FROM THE CHARGE/WAKE-UP COMPARATOR B.<br>0=DO NOT INVERT THE OUTPUT FROM THE CHARGE/WAKE-UP COMPARATOR B.<br>(DEFAULT) |
| B3 | - | UNIMPLEMENTED. READ AS '0'. |
| B2 | CCOMPA | CHARGE CONTROL COMPARATOR OUTPUT A. READING THIS BIT RETURNS THE STATUS OF THE CHARGE CONTROL/WAKE-UP COMPARATOR A OUTPUT. WRITES TO THIS BIT HAVE NO EFFECT. |
| B1 | CCAEN | CHARGE CONTROL FUNCTION ENABLE BIT.<br>1=CHARGE CONTROL IS ENABLED. CFILT AND CCTRL ARE USED TO CONTROL SWITCHING REGULATOR.<br>0=CHARGE CONTROL IS DISABLED (DEFAULT). CFILT AND /CCTRL ASSUME NORMAL PORTC FUNCTION. |
| B0 | CPOLA | CHARGE CONTROL POLARITY BIT A.<br>1=INVERT THE OUTPUT FROM THE CHARGE\WAKE-UP COMPARATOR A.<br>0=DO NOT INVERT THE OUTPUT FROM THE CHARGE/WAKE-UP COMPARATOR A.<br>(DEFAULT) |

FIG. 11 CHARGE/LEVEL DETECT CONTROL REGISTER (CHGCON)

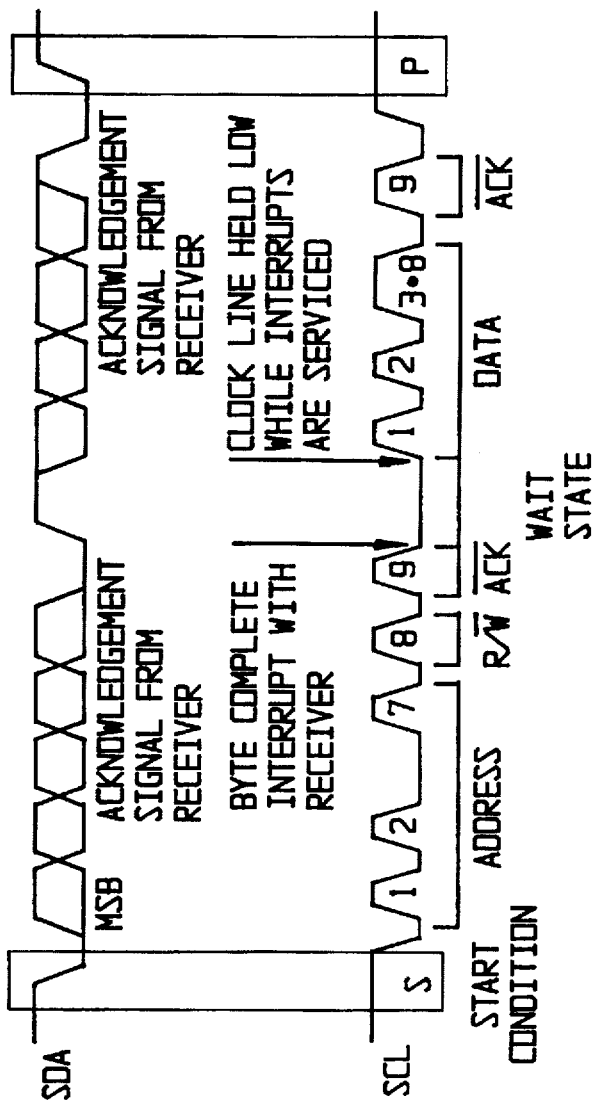

DIGITAL TRIMMING OF ON-CHIP ANALOG COMPONENTS

CROSS-REFERENCE TO RELATED APPLICATION

This application is a continuation of co-pending application Ser. No. 08/526,529 of the same inventors, filed on Sep. 11, 1995, assigned to the same assignee.

BACKGROUND OF THE INVENTION

This invention relates to trimming of electronic analog components and, in particular, to measuring parameters of analog components during testing and storing calibration constants obtained from the measured parameters in memory for use in trimming such analog components and increasing the precision of measurements made by the analog components.

When using analog electronic components, it may be difficult to obtain precise voltages or measurements because analog components have many parameters that vary with process, temperature or power supply. For example, one or more reference voltages for an integrated circuit may be generated from a bandgap reference voltage circuit. If, however, the bandgap reference voltage is not accurate due to variations in power supply or temperature, then all reference voltages derived therefrom will also be inaccurate. This could induce substantial errors in the operation of the integrated circuit.

Moreover, precise resistor values are also important in analog circuits for achieving precise current values. For example, if resistor values in A/D converters are inaccurate, then the voltage range associated with each of the bits of the A/D converter may be in error.

However, the fact remains that many analog circuits, such as analog-to-digital (A/D) converters and reference voltage circuits, require precise component values or closely matched components in order to achieve high precision.

One technique for achieving more precise resistor values includes the use of lasers to trim a resistor after fabrication, in order to obtain a precise value for that resistor. For example, a film resistor may be fabricated with a lower resistance value than desired whereby a laser beam can be used to remove a portion of the film of the resistor thereby increasing its resistance and effectively "trimming" the resistor to precisely the desired value. However, such trimmed resistors may drift after trimming and such drifting can be accelerated by thermocycling.

U.S. Pat. No. (USPN) 4,777,471 to Comer discloses another technique for trimming element values in an integrated circuit by the use of multiple fusible link elements. However, such a technique consumes substantial area on the integrated circuit, and requires additional external pins.

U.S. Pat. No. 4,335,371 discloses a circuit for trimming an A/D converter. The A/D converter includes an on-chip programmable read-only memory (PROM) that decodes a plurality of trim bits for adjusting the voltage $V_{REF}/8$ that is applied to the A/D converters. Such a technique, however, requires substantial additional circuitry of a trimming network and decoders, and applies only to A/D converters.

It is therefore an object of the present invention to provide an improved technique for increasing the precision of measurements made via analog components.

It is another object of the present invention to provide a technique for trimming analog components by first measuring various parameters of the analog components during testing and then storing calibration constants obtained from the measured parameters in memory for use in digitally trimming such analog components and for increasing the precision of measurements made by the analog components.

SUMMARY OF THE INVENTION

A microcontroller for use in battery charging and monitoring applications is disclosed. The microcontroller includes a microcontroller and various front-end analog circuitry including a slope analog-to-digital (A/D) converter and a multiplexer for allowing a plurality of analog input signals to be converted to a digital count indicative of its signal level of which is used for obtaining a precise voltage measurement of the selected analog input.

In order to make the measurements of the selected analog inputs more precise, the microcontroller utilizes a unique calibration procedure whereby selected parameters/voltages that are subject to variation and change are measured during test and corresponding calibration constants are calculated therefrom. These constants are then formatted and stored in program memory and are subsequently used by the microprocessor in calculating a more precise value for the analog input voltages.

The analog circuitry of the microcontroller also includes two charge rate control channels for use in controlling the charge/discharge rate of an external battery. Each charge rate controller includes a digitally programmable digital-to-analog converter (DAC) used in conjunction with a comparator. The DAC provides a programmable voltage to a first input of the comparator while the second input of the comparator receives a voltage indicative of the current of the battery. The charge rate controller functions to make the voltage indicative of sensed battery current substantially equal to the programmable output voltage of the DAC thereby providing a control signal to an external transistor that controls the charging/discharging rate of the battery.

Each charge controller may also be used as a level detector to determine when an input signal exceeds or falls below a digitally programmable threshold level. The programmable threshold level is digitally set by programming the desired threshold voltage at a first input of the comparator via the DAC whereby the other input of the comparator receives an analog input signal such as a voltage indicative of battery current. The level detector functions to set a flag and provide an interrupt to the microprocessor when the analog input signal exceeds (or alternately falls below) the programmable threshold voltage. Accordingly, this interrupt may be used to "wake-up" the microprocessor from a sleep mode thereby providing a digitally programmable threshold for waking-up the microprocessor.

Alternately, by programming the two level detectors to detect opposite polarities, a single window detector may be implemented whereby an interrupt to the microprocessor will occur when the analog input signal exceeds a first threshold level or falls below a second threshold level. This would allow both positive and negative battery current exceeding a predetermined magnitude to be detected. Accordingly, such a window detector is useful in battery applications for detecting when the battery that is currently not in use is subsequently placed in a device that draws/discharges current from the battery current or placed in a battery charger that supplies a charging current to the battery.

The microcontroller also includes an I²C interface for supporting a bi-directional two wire bus and data transmission protocol that is useful for serially communicating with other peripheral or microcontroller devices. The I²C interface employs a comprehensive protocol to insure reliable transmissions and reception of data. When transmitting data, one device is the master and generates the clock signal while the other device acts as the slave. Each device in the I²C interface protocol has a specific address associated therewith such that when a master wishes to initiate a data transfer, it first transmits the address of the device it wishes to talk to and if the address sent by the master matches the address of a slave device, then that slave device is selected for data transfer. To accomplish data transmission, the master device generates both start and stop conditions to determine the start and stop of data transmission whereby data is transmitted between the start and stop conditions.

By making use of the I²C interface, the microcontroller can be serially programmed while in the end application circuit. Such a feature allows customers to manufacture boards with un-programmed devices and then program the microcontroller just before shipping the product. This allows the most recent firmware or a custom firmware to be programmed.

The microcontroller 10 can be placed in a program mode by holding the serial clock and serial data pins of the device low while raising the voltage programming pin to a required programming voltage. Once in the program mode, the user program memory, as well as the test program memory, can be accessed and serially programmed while in its end-use application.

BRIEF DESCRIPTION OF THE DRAWINGS

The present invention will be better understood with a detailed description taken in conjunction with the accompanying drawings in which:

FIG. 2 is a graphical diagram illustrating the clock cycle of the microcontroller;

FIG. 4 is a table illustrating the address locations and data formats for the calibration constants stored in the EPROM memory of FIG. 1;

FIG. 5 is a table illustrating the sampling interleaving sequence of the analog inputs for A/D conversion;

FIG. 7 is a detailed schematic/block diagram of a zeroing circuits of FIG. 1;

FIG. 9 is a table illustrating the course-tuned current output of the DACs of FIG. 1 according to the upper 5 bits of log DAC registers;

FIG. 11 is a table illustrating the bits of a charge/level detect control (CHGCON) register.

FIGS. 14 and 15 illustrate 7-bit and 10-bit formats, respectively, for addressing I²C devices;

FIG. 16 is a graphical diagram illustrating the generation of an acknowledge by a slave device;

FIG. 17 is a graphical diagram illustrating an example of I²C data transfer using the 7-bit address format;

FIG. 22 is a table illustrating the different commands available for serial program operation;

DETAILED DESCRIPTION OF THE PREFERRED EMBODIMENT

System Overview

Figure 1:
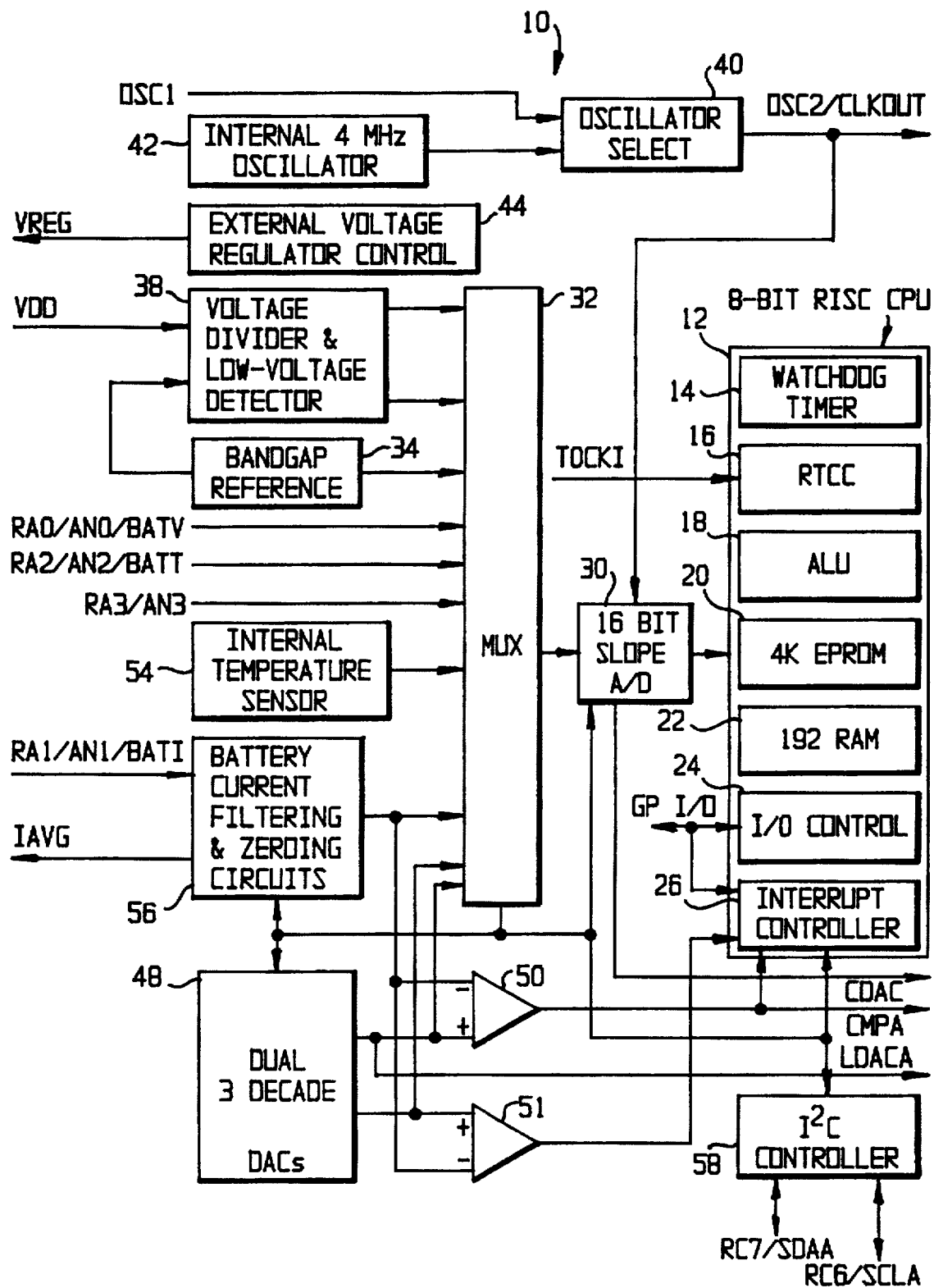
FIG. 1 is a detailed block diagram illustrating an system overview of a microcontroller embodying the present invention.

Referring to FIG. 1, a detailed block diagram illustrating microcontroller integrated circuit 10 embodying the present invention is shown. Microcontroller 10 may take the form of the MTA 140xx/Callisto programmable control integrated circuit manufactured by Microchip Technology Incorporated for use in applications such as battery charging and battery monitoring.

Microcontroller 10 is designed for high-volume applications in portable computing, cellular phone, camcorders and other low-cost products where battery charging and monitoring control is desired. However, it is understood that microcontroller 10 and the present invention is not limited to such applications and may be used in other applications (such as those where it is desired to accurately measure input analog voltages) as will be apparent from the following detailed description.

Microcontroller 10 includes microcontroller core 12 which may take the form of the PIC16C6X/7X microcontroller core also manufactured by Microchip Technology Incorporated. Microcontroller core 12 is an 8-bit reduced instruction set computer (RISC) CPU that includes an 8 level deep stack and multiple internal and external interrupt sources. The microcontroller core has a harvard architecture with separate instruction and databuses for allowing a 14-bit wide instruction word with the separate 8-bit wide data. Moreover, a two-stage instruction pipeline allows for all instructions (35 total) to execute in a single cycle, except for program branches which require two cycles.

Referring to FIG. 2, a graphical diagram illustrating the clock cycle of microprocessor core 12 is shown. The clock input, either from pin OSC1 or internal oscillator 42, is internally divided into four phases Q1, Q2, Q3 and Q4 whereby the four phases generate a full processor clock cycle. Two clock cycles are required to complete any instruction whereby an instruction is fetched during one clock cycle and executed during the next clock cycle. However, due to a two-stage pipeline, the execution of one instruction cycle is overlapped with the fetching of the next instruction cycle thereby effectively reducing the cycle time to one clock cycle per instruction. If, however, an instruction causes the program counter to change, such as a GOTO instruction, then two cycles are required to complete the instruction. Briefly, a fetch begins with the program counter (PC) incrementing during the Q1 portion of the clock cycle. The fetch instruction is latched into the instruction register which is decoded and executed during the Q2–Q4 portions of the clock cycle.

Microcontroller core 12 includes watchdog timer 14 that is realized as a free running on-chip RC oscillator which does not require and any external components. The watchdog timer typically has a nominal time-out period of 18 milliseconds. However, if longer time-out periods are desired, a prescaler with a division ratio of up to 1:128 can be assigned to the watchdog timer under software control. Accordingly, time-out periods up to 2.3 seconds can be realized.

Microprocessor core 12 also includes real-time clock/counter (RTCC) 16 and arithmetic logic unit (ALU) 18 for performing calculations. Also included is erasable programmable read-only memory (EPROM) 20 that includes 64 words of calibration memory space for storing various calibration constants as will be described in more detail hereinafter. Also, microprocessor core 12 includes random access memory (RAM) 22 for temporary storage, input/output (I/O) control 24 for providing general purpose I/O, and interrupt controller 26 for receiving and responding to interrupts.

Several analog peripherals form an analog front-end for the microcontroller core 12. Such analog peripherals provide signal conditioning and analog-to-digital functions useful in many applications such as battery charging and monitoring control. All analog functions are directly controlled by the microcontroller core to maximize flexibility and to allow for customizing via firmware.

The front-end analog peripherals include slope A/D converter 30 and multiplexer (mux) 32 for allowing a plurality of external analog inputs to be converted to a digital count indicative of its signal level. Slope A/D converter 30 is a medium-speed, high-precision converter that is ideal for monitoring DC and low frequency AC signals.

Also included in the analog front-end circuitry is bandgap reference 34 which eliminates the need for an external reference voltage source. Bandgap reference block 34 also provides a voltage to voltage divider block 38 that generates precise high and low slope reference voltages for use by slope A/D converter 30. The high slope reference is typically 1.23 volts and is used for the slope detect upper limit in the A/D conversion. The low slope reference voltage is typically ⅑ the high slope reference voltage or about 0.14 volts. Further, bandgap reference block 34 supplies a voltage to low voltage detector 38 for detecting the presence of a low voltage condition.

Oscillator select block 40 selects between an external oscillatory signal (OSC1) or an internal 4 MHz oscillatory signal as provided via internal oscillator 42. The selected oscillatory signal provides a clock signal to slope A/D converter 30 as well as an external clock signal (CLKOUT).

Microcontroller 10 also includes on-chip voltage regulator control 44 for providing an external regulated voltage VREG thereby eliminating the need for external voltage regulators. Voltage regulator control 44 is also selectable for 3 or 5 volt operation.

Two, 3-decade, 8-bit digital-to-analog converters (DACs) 48 are combined with two comparators, 50 and 51, to form two charge control channels. The dual DACs and comparators can alternatively be configured to function as level detectors, either as a single window detector or two separate level detectors. Furthermore, these level detectors can be used to generate interrupts to the microcontroller core to provide wake-up or limit detect functions.

An on-chip temperature sensor 54 is also included for applications requiring internal temperature monitoring.

Filtering and zeroing circuits 56 are used to increase the accuracy of low value, analog input measurements by simulating a zero current condition. This "zeroing" technique may be used to enhance the accuracy of measuring low battery currents.

Also included is $I^2C$ interface controller 58 for allowing microcontroller 10 to communicate with other $I^2C$ compatible devices via its serial data pin (SDAA) and serial clock pin (SCLA). Such interface may also be used to program microcontroller 10 while in an end-use application.

Slope A/D Converter

Figure 3:
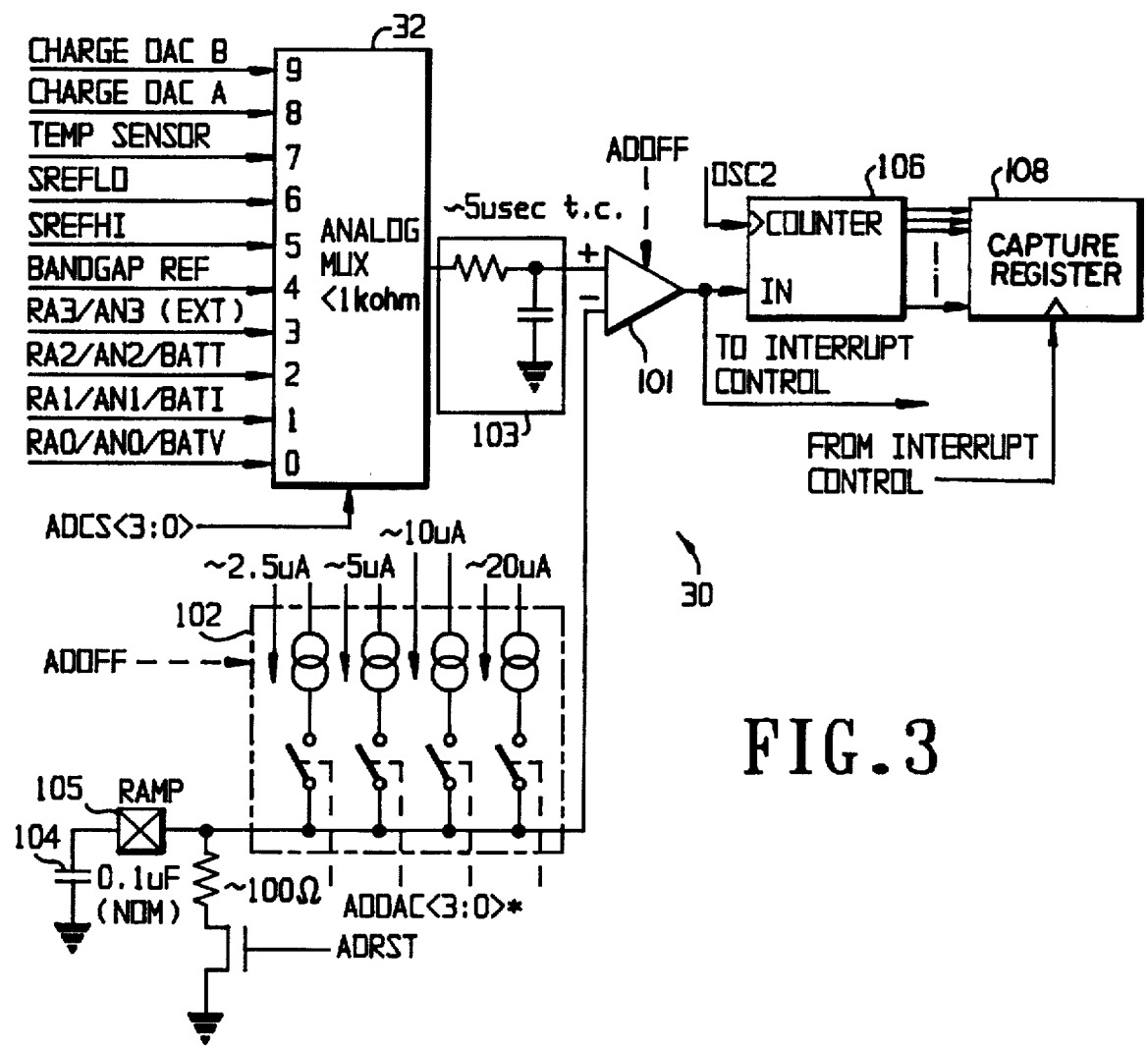
FIG. 3 is a detailed schematic/block diagram of the slope analog-to-digital converter shown in FIG. 1.

Referring to FIG. 3, a more detailed schematic/block diagram of slope A/D converter 30 is shown. Slope A/D converter 30 is the heart of the analog front-end circuitry and is used to translate a selected one of a plurality of analog inputs, appearing at the inputs of mux 32, into digital count values for obtaining a voltage measurement of the selected input. For example, A/D converter 30 may be used to translate battery voltage, current and temperature into digital count values for both battery monitoring and charging control. The plurality of analog inputs that are selected for analog-to-digital conversion via mux 32 may include analog inputs representing a battery voltage (BATV), a battery current (BATI), a battery temperature (BATT), an external analog voltage (RA3/AN3), the bandgap reference voltage via bandgap reference block 34, high and low slope reference voltages (SREFHI, SREFLO) via voltage divider block 38, an internal temperature voltage via temperature sensor 54, and two DAC outputs (Charge DAC A and Charge DAC B) via dual DAC block 48.

RC low pass filter 103 is coupled between the output of analog mux 32 and the non-inverting terminal of comparator 101. A typical time constant for RC filter 103 is 5 microseconds.

The heart of slope A/D converter 30 is precision comparator 101 having a non-inverting input coupled to receive one of the selected plurality of analog inputs, and an inverting input coupled to external pin 105 (the RAMP pin) External capacitor 104 is coupled to pin 105 for generating a ramp voltage there across.

4-bit programmable slope control DAC 102 includes a plurality of switchable current sources for selectively controlling the charge current to external capacitor 104 from a range 0 to 37.5 microamps (uA) in steps of 2.5 uA via 4-bit digital control signal ADDAC. The external capacitor may have a value of, for example, 0.1 uF, and should have a low voltage coefficient for optimum results.

The output of comparator 101 is supplied to an input of counter/capture timer 106, the output of which is supplied to the input of capture register 108.

Transistor 109 is coupled to DAC 102 for disabling all current sources if signal ADRST is a logic "1".

In operation, each analog channel is converted to a digital count independently by selecting one of the plurality of analog inputs via mux 32. A conversion takes place by first resetting counter 106 and register 108 while simultaneously discharging external capacitor 104 to ground for a predetermined minimum time of, for example, 200 microseconds. Reset is then released and counter 106 begins counting at the same time capacitor 104 begins to charge based upon the charging current supplied by DAC 102. It is worth noting that the amount of time required for discharging capacitor 104 does not have to be exact due to the capability of microcontroller 10 to cancel the effects of an indeterminate, non-zero capacitor voltage that may result at reset. Likewise, it is not critical that the counter begins counting at exactly the same time as capacitor 104 begins charging. When the voltage across external capacitor 104 exceeds the voltage of the selected analog input, comparator 101 switches from a logic high to a logic low. This transition initiates an interrupt to microcontroller core 12 whereby an interrupt control signal causes a capture event to occur by latching (capturing) the count of counter 106 into capture register 108. The count stored in register 108 represents the time that it took for capacitor 104 to charge up and exceed the selected analog input voltage and corresponds to voltage measurement of the selected analog input. This count is then used to obtain a more precise voltage measurement for the analog input selected by using unique calibration procedures and filter algorithms as will now be described. In a similar manner, a digital count for each analog input may be obtained by independently selecting each analog input via mux 32 thereby digitally measuring the voltage of each of the plurality of analog inputs.

Calibration Procedure

In order to make the measurements of the selected analog inputs more precise, the present invention utilizes a unique calibration procedure as will now be described. Generally, a minimum set of parameters will need to be adjusted or "trimmed" during testing whereby calibration constants will be calculated and stored into EPROM user space. These minimum set of parameters that require trimming include the ratio of the lower slope reference voltage to the upper slope reference voltage of the slope A/D converter, the bandgap voltage, the internal temperature sensor (thermistor) voltage, and selected oscillator frequencies. Accordingly, the present invention measures these parameters during testing and calculates calibration constants, as set forth below, all of which will be stored in EPROM 20 user space for subsequent retrieval and use whereby many of these constants will be used increasing the accuracy of A/D measurements more accurate.

A. A/D Slope Reference Calibration Constant (Kref)

The on-chip slope A/D converter 30 requires a known ratio between two voltage points in order to determine the coefficients of a linear transfer function. Slope reference generator 36 (of FIG. 1) generates an upper slope voltage and a lower slope voltage via a bandgap voltage supplied from bandgap reference circuit 34. The ratio of the lower slope reference voltage to the upper slope reference voltage is calculated from the measured values of their respective voltages.

In particular, the procedure used to calculate the A/D slope reference calibration constant is as follows. Analog mux 32 is set to select the upper slope reference voltage (SREFHI) which is one of the voltages supplied by slope reference generator 36. Using precision voltage measurement circuitry, measure the upper slope reference voltage and record its value. The precision voltage measurement circuitry is coupled to the output of mux 32 and may be located on a separate test load board. Now, switch analog mux 32 to select the lower slope reference voltage (SREFLO), which is the other output of slope reference generator 36. Using the precision voltage measurement circuitry, measure the lower slope reference voltage at the output of mux 32 and record its value. Now calculate the calibration constant Kref which is equal to the ratio of SREFLO/(SREFHI−SREFLO).

B. Bandgap Reference Voltage Calibration Constant (Kbg)

The bandgap reference voltage provided by bandgap reference circuit 34 should be approximately 1.23 volts. However, this voltage exhibits a slight dependency with supply voltage (less than 1 millivolt) and with temperature (typically less than 10 millivolts). Accordingly, the actual voltage supplied by bandgap reference circuit 34 should be measured the value of which should be stored in EPROM 20.

In order to obtain an actual measurement of the voltage supplied by bandgap reference circuit 34, the following procedure is employed. First, set analog mux 32 to select the output voltage of bandgap reference circuit 34. Using precision voltage measurement circuitry, accurately measure the bandgap voltage appearing at the output of mux 32. This measured voltage is the bandgap reference voltage calibration constant Kbg.

C. Thermistor Calibration Constant (Kthrm)

Although the temperature coefficient of internal temperature sensor/thermistor 34 is relatively constant over temperature, the absolute magnitude of the voltage output can vary significantly with process. Therefore, the absolute magnitude of the output voltage of thermistor 54 should be measured at a predetermined temperature whereby this measured value will be stored in the calibration EPROM.

The procedure for measuring the thermistor voltage is identical to the above-described procedure for measuring the bandgap voltage with the exception that the mux is programmed to select the output of thermistor 54.

D. Temperature Coefficient Calibration Constant (Ktc)

The temperature coefficient of the thermistor is assumed to be relatively constant over temperature. However, the temperature coefficient may exhibit a slight dependency on process. This dependency may be extrapolated by first measuring the thermistor voltage (at the output of mux 32) and then by adjusting the temperature coefficient calibration constant (Ktc) based upon this measured voltage value.

The temperature coefficient calibration constant is typically obtained from characterization data of the thermistor output voltage with respect to various temperatures wherein a correlation exists between the thermistor output voltage and its slope. Accordingly, based upon the output voltage at a given temperature, the temperature coefficient of the thermistor may be compensated to improve accuracy.

Although not critical for increasing the accuracy of A/D conversions, these next two constants are important for making accurate time-base measurements/events.

E. Internal Oscillator Calibration Constant (Kin)

Calibration for the frequency of the internal clock due process variation is required to obtain high precision. The calibration factor Fosc is calculated from the measured frequency of the internal clock, which can be measured at the external OSC2/CLKOUT pin. In particular, the calibration factor Kin is calculated to be the integer function of [(measured frequency−3.00 Mhz)/10 Khz]. Note that this assumes the measured frequency will be greater than 3.0 MHz.

F. Watchdog Timer Calibration Constant (Kwdt)

Calibration for the frequency of the watchdog timer due to process variation is also required for high precision. The calibration factor Kwdt is calculated from the measured frequency of operation of the watchdog timer 14 of FIG. 1. Although the frequency of the watchdog timer is not provided at an external pin, the frequency of the watchdog timer can be measured by monitoring the logic state of a predetermined bit in a status register whereby the logic state of that bit is indicative of the logic level of the watchdog timer signal. The calibration factor Kwdt is equal to the integer function of [(measured frequency/1 Hz].

After obtaining each of the calibration constants/factors described above, each are formatted and programmed into the EPROM memory 20 at the address locations and data formats as shown in FIG. 4.

A/D Conversions Using Stored Calibration Constants

Conversion of the A/D count values obtained by A/D converter 30 to a corresponding input voltage value is performed by the microprocessor core 12 according to the formula shown in EQN. 1.

$$Vin = \frac{(Cin - Coffset)}{(Cbg - Coffset)} \times Kbg \qquad \text{EQN. 1}$$

where:

Coffset = Creflo−Kref(Crefhi−Creflo);

Vin = Resulting (digital) absolute voltage value of selected input;

Cin = A/D count value for selected input;

Creflo = A/D count value A/D lower reference point;

Crefhi = A/D count value for A/D upper reference point; and

Cbg = A/D count value for bandgap reference.

The offset term (Coffset) compensates for turn-on delays or voltage offsets that may occur in starting the voltage ramp of the slope A/D converter. For example, if the ramp counter starts counting before the ramp voltage begins increasing, or if the ramp voltage does not start from exactly 0 volts, an offset count will occur with every conversion. Accordingly, the offset term is the count value of the turn-on delay or offset voltage.

When performing A/D conversions for the various analog inputs, the present invention interleaves the selection of analog inputs for A/D conversion for maximizing the sampling rate for high priority signals, such as the battery current, and for reducing the sampling rate for low priority signals that change at relatively slow rates, such as temperature inputs. Referring to FIG. 5, the interleaving priority scheme for sampling the various analog input signals is shown. Battery current is the highest priority and is sampled 8 times per 16 A/D cycles. Battery voltage is the next priority and is sampled 2 times per 16 A/D cycles. Battery temperature via the external thermistor input and internal temperature are each sampled once during 16 A/D cycles. Likewise, current network zero voltage, bandgap voltage, and A/D lower and upper reference voltages are each sampled once for every 16 conversion cycles.

Figure 6:
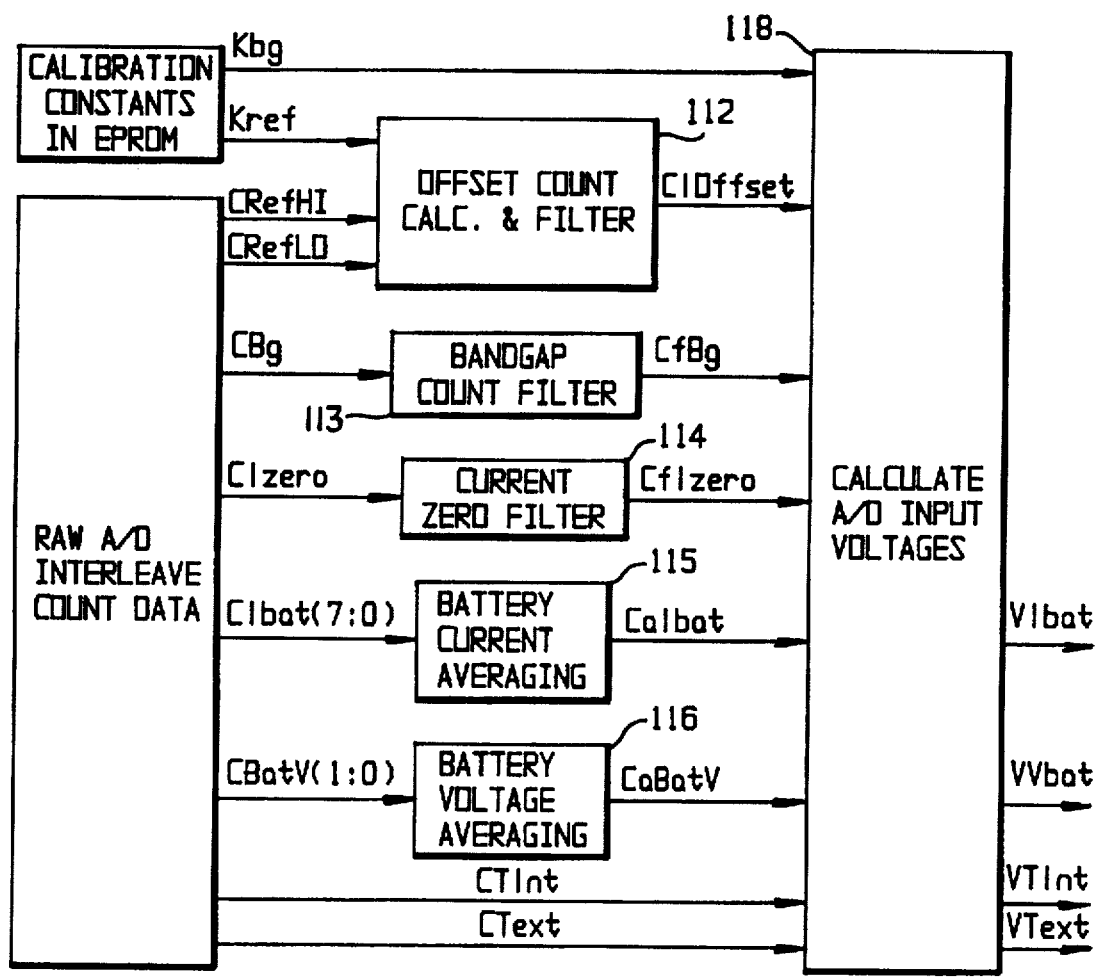
FIG. 6 is a flow diagram illustrating the A/D data flow.

In order to stabilize the reference value and further enhance A/D accuracy, the raw count data of certain analog inputs obtained from the A/D converter is filtered prior to calculating the actual voltage values for the A/D analog inputs. Referring to FIG. 6, a flow diagram is shown illustrating the A/D data flow including filter algorithms 112–114 and average algorithms 115–116 for use in calculating actual voltage values from the A/D count values. The count value for the bandgap voltage (Cbg) is filtered by calculating the rolling average of the last 16 count values obtained. The filtered value of the bandgap count (Cfbg) is calculated as shown in EQN. 2.

$$Cfbg_i = \frac{(Cbg_i + (15 \times Cbg_{i-1}))}{16} \qquad \text{EQN. 2}$$

where the subscript i denotes the interleave sequence number.

This filtered value of the bandgap count is then supplied to microprocessor core 12 and is used to calculate the voltages at the output of block 118 as will be described later.

The count offset value (Coffset) is filtered by calculating the rolling average of the last 16 count values obtained as shown in EQN. 3.

$$CfOffset = \frac{(Coffset_i + (15 \times Coffset_{i-1}))}{16} \qquad \text{EQN. 3}$$

where

Coffset$_i$ = Creflo$_i$−Kref(Crefhi$_i$−Creflo$_i$)

This filtered value of the offset count (CfOffset) is also supplied to microprocessor core 12 and is used to calculate the A/D input voltages.

The current input zero offset count (CIzero) is filtered by calculating the rolling average of the last 16 count values obtained as shown in EQN. 4.

$$CfIzero = \frac{(CIzero_i + (15 \times CIzero_{i-1}))}{16} \qquad \text{EQN. 4}$$

This filtered value of the current input zero offset count (CfIzero) is also used by microprocessor core 12 to calculate the input voltages.

The present invention also filters/averages the raw count data obtained from the battery voltage and battery current channels. The battery current count value (CIbat) is filtered by taking an average of the 8 samples of the input channel from the interleave sequence as shown in EQN. 5.

$$CfIbat = (1/8) \sum_{s=0}^{7} (CIbat_s) \qquad \text{EQN. 5}$$

The filtered battery current count value (CfIbat) reduces the quantity of data that is sent to the digital integrators that track battery capacity.

Likewise, the count value for the battery voltage (CBatV) is filtered by calculating the average of the two samples of the input channel from the interleave sequence as shown in EQN. 6.

$$CfVbat = (1/2) \sum_{s=0}^{1} (CVbat_s) \qquad \text{EQN. 6}$$

The following filtered count values, in conjunction with the calibration constants stored in EPROM 20, may be used to calculate a more precise digital value corresponding to the input voltages for battery current and battery voltage as shown in EQNs. 7 and 8, respectively.

$$VIbat = \frac{(CfIbat - CfIzero - CfOffset)}{(CfBg - CfOffset)} \times Kbg \qquad \text{EQN. 7}$$

$$VVbat = \frac{(CfVbat - CfOffset)}{(CfBg - CfOffset)} \times Kbg \qquad \text{EQN. 8}$$

Note that EQN. 7 includes a term in the numerator (CfIzero) which is a count corresponding to an input zero current condition and is used to increase the accuracy of the measurement for low current values as will be explained in more detail hereinafter.

Additionally, a more precise digital value for the internal and external temperature voltages may be calculated as show in EQNs. 9 and 10, respectively.

$$VTint = \frac{(CTint - C\!f\!Offset)}{(C\!f\!Bg - C\!f\!Offset)} \times Kbg \qquad \text{EQN. 9}$$

$$VText = \frac{(CText - C\!f\!Offset)}{(C\!f\!Bg - C\!f\!Offset)} \times Kbg \qquad \text{EQN. 10}$$

Accordingly, the present invention includes the measuring and storing in memory of various calibration constants and various filtering algorithms for obtaining very precise measurements of selected analog inputs such as these representing the voltage, current and temperature of an external battery.

Zeroing Circuit

When trying to measure low level analog signals, it is important to know exactly where the zero reference point lies in order to obtain accurate results. Accordingly, the present invention includes a zeroing technique to increase the accuracy of measuring low current values. Referring to FIG. 7, a detailed schematic/block diagram of zeroing circuit 138 of block 56 (of FIG. 1) is shown. The zeroing circuit includes two matched pass gates 140 and 142 for simulating a zero current condition. If switches 140 and 142, which may take the form of field-effect transistors, are not precisely matched, the mismatch, if any, may be measured and stored as an additional calibration constant in EPROM 20 for use in improving A/D accuracy. Switch 142 is responsive to microcontroller core 12 signal ADZERO while switch 140 is responsive to the inversion thereof via inverter 141. Also included in zeroing circuit 138 are input protection circuit 147 and switchable current bias source 149.

In operation, when switch 140 is open and switch 142 is closed, the voltage corresponding to a zero current condition is supplied to mux 32 (and comparators 50 or 51). Accordingly, the zero current condition occurring at pin 143 is simulated. This enables the slope A/D converter to obtain a digital count corresponding to a zero current at pin 143. Therefore, when switch 140 is closed and switch 142 is open, subsequent digital counts corresponding to subsequent analog current measurements at pin 143 are computed relative to this zero count. This zeroing technique provides very high accuracies at low current values when such high accuracy is most needed.

For capturing even smaller current pulses, an optional filter capacitor 152 may be coupled to current averaging pin (IAVG) 154 and ground. Capacitor 152 and internal resistor 156 form an RC network to act as a DC averaging filter whereby capacitor 152 can be adjusted to obtain a desired time constant. Switch 158 is coupled between zeroing circuit 138 and IAVG pin 154 and is closed during A/D sampling periods and automatically opened during the zeroing operation via the inversion of signal ADZERO.

In a battery monitoring application, zeroing circuit 138 may be used to increase the accuracy of the measured current supplied by battery 146 whereby current is measured at pin 143 by connecting an external sense resistor (150) in series with the battery. In particular, the output of battery 146 coupled to circuit node 148 the latter of which is coupled to pin 143 and returned to ground through sense resistor 150. Sense resistor 150 is typically a low value resistor, for example, on the order of 0.05 ohms. Accordingly, low voltages are typically generated across resistor 150. For example, for a +/- 5-amp battery pack and a 0.05 ohm sense resistor, a voltage range of −0.25 to +0.25 volts (the polarity being a function of whether the battery is being charged or is supplying an output current), appears at pin 143. Furthermore, in the case of a low battery current, the voltage appearing across resistor 150 is very small, for example, on the order of millivolts. Therefore, in order to obtain an accurate measurement of the battery current for such low currents, it is important to know what A/D digital count corresponds to a zero current condition. For example, if a zero current condition corresponds to an A/D digital count of 100, then such offset must be taken into account when measuring voltage corresponding to the battery current, especially at low currents which yield relatively low digital counts. As described above, zeroing circuit 138 provides such a zero current count by simulating a zero current condition via switches 140 and 142.

Charge Control/Current Flow Detectors

As discussed in the system overview, microcontroller 10 includes two, 3-decade, 8-bit DACs that may be combined with comparators 50 and 51 (of FIG. 1) to form two charge rate control channels. Alternately, the dual DACs and comparators can be configured to function as level detectors, either as two separate level detectors or as a single window detector.

Figure 8:
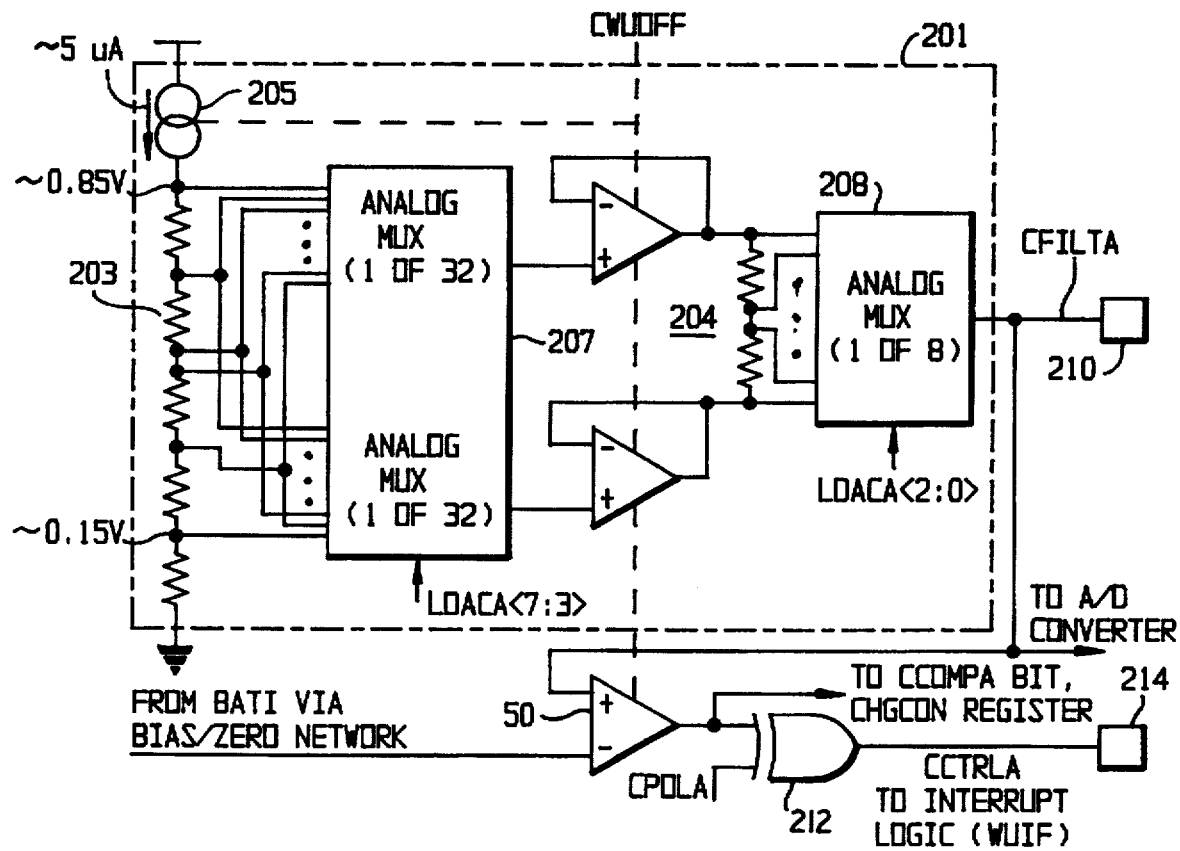
FIG. 8 is a detailed block diagram illustrating a first charge controller/level detector of the microcontroller.

Referring to FIG. 8, a detailed block diagram is shown illustrating one of the dual DACs (201), used in conjunction with one of the comparators (50), to comprise a first charge control channel (Channel A). Briefly, DAC 201 supplies a programmable voltage at its output (the output of mux 208) and to the non-inverting input of comparator 50. The other (inverting) input of comparator 50 is coupled to receive a voltage from zeroing circuit 56 indicative of a current sensed from an external battery for example. When operating in a charge control mode, the output of comparator 50 is coupled through XOR gate 212 and supplies a charge control signal at external pin 214 whereby external pin 214 would be coupled to an external field-effect transistor (FET) for controlling the battery charge current. In the charge control mode, the charge control circuit of FIG. 8 provides feedback to make the voltage (corresponding to the sensed current) substantially equal to the output voltage of DAC 201 and effectively controls the amount of charging seen by the battery.

When operating as a level detector, the circuit acts as a battery current monitor such that when the voltage (corresponding to the battery sense current) falls below, or alternately rises above, the DAC 201 output voltage, comparator 50 changes states and causes an interrupt to microcontroller core 12 by setting the wake-up interrupt flag (WUIF). Accordingly, this interrupt may be used to wake-up the microprocessor from a sleep/idle mode.

Referring in more detail to DAC 201, it includes two resistor ladders, 203 and 204, current source 205 and analog multiplexers 207 and 208. Resistor ladder 203 is used for a course adjustment of the output voltage while resistor ladder 204 is used to fine tune the output of the first ladder. The course resistor ladder 203 is matched to the current sensed bias resistor so that the center point of the ladder is approximately equal to zero current flow. Accordingly, this allows DAC 201 to control or monitor both charge and discharge current flow, i.e., both positive and negative current flow.

Resistor ladder 203 is comprised of 32 taps and is divided into 2 decades/regions. The first decade is defined for controlling trickle or topping charge rates and has resolution of 5 millivolts (mV) and a range of +/- 50 mv. This corresponds to a current resolution of 100 milliamps (mA) and a range of +/- 1 amp with the use of an external 0.05 ohm sense resistor.

The second decade is defined for fast charge application whereby the resolution is 50 mV with a maximum range of +/− 0.35 volts. This corresponds to a current resolution of 1 amp and a range of +/− 7 amps with an external 0.05 ohm sense resistor.

The fine tune resistor ladder has 8 taps and is used to divide the buffered output voltage from the course ladder. This yields an overall minimum DAC voltage resolution of approximately 0.714 mV or a current resolution of about 14.3 mA with a 0.05 ohm sense resistor.

The voltage granularity and range of DAC 201 depends on the value of the logic bits stored in a DAC A register (LDACA). LDACA register is a data register for controlling the output voltage of DAC 201 wherein the upper five bits (bits 3–7) of the LDACA register controls mux 207 for selecting an voltage output range via course ladder 203 according to the table shown in FIG. 9. FIG. 9 also shows a corresponding sense current range using a 0.05 ohm resistor where current ranges shown in ( ) in the bottom half of the table denote negative current corresponding to charging of a battery. Further, the three lower bits (bits 0–2) of the LDACA register control mux 208 for selecting the fine tune adjustment via ladder 204 according to the table shown in FIG. 10.

Figures 10, 12:
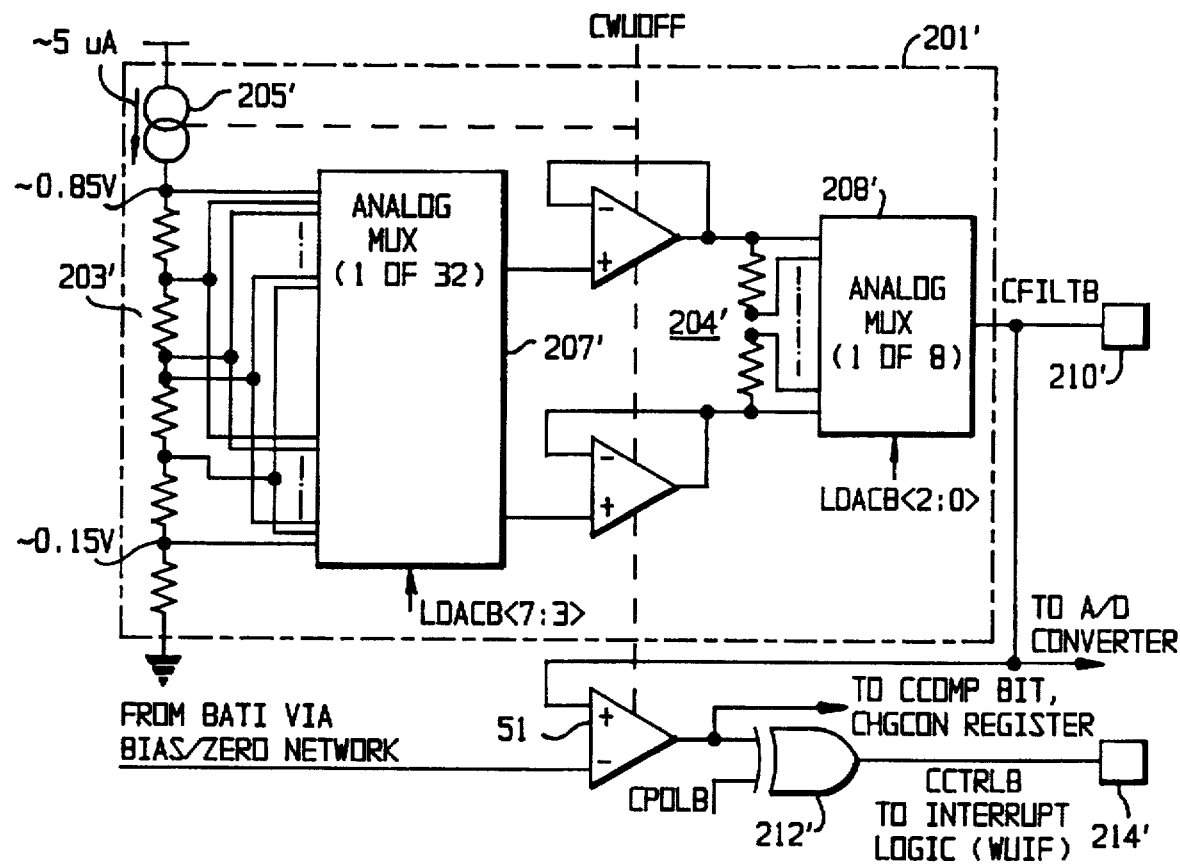
FIG. 10 is a table illustrating the fine-tuned current output of the log DACs of FIG. 1 according to the lower 3 bits of log DAC registers.
FIG. 12 is a detailed block diagram illustrating a second charge controller/level detector.

As an example, if a positive/discharge current of 340 milliamps was desired, the LDACA register would be set to a binary value of "00011010". The upper 5 bits ("00011") yields a course range of 300–400 mA as shown in FIG. 9 while the lower 3 bits ("010") selects the fine tune setting of ⅛ times the course range maximum, as shown in FIG. 10, or approximately 37.5 mA. Note that if a negative/charge current of 340 milliamps was desired, then LDACA register would be set to the binary value of "<u>1</u>0011010".

The output of analog mux 208, which is the analog voltage output from DAC 201, is supplied as one of the plurality of inputs of A/D converter 30 and may be connected to an external filter capacitor via external pin 210.

The output of analog mux 208 is also coupled to the non-inverting input of comparator 50 the latter of which has an inverting input coupled to receive a current sense voltage corresponding a sensed current of an external battery (BATI) after passing through zeroing circuit 56.

The output of comparator 50 is coupled to a first input of XOR gate 212 the latter of which has a second input coupled to receive charge control polarity bit, CPOLA, for inverting the output of comparator 50 when set to a logic "1". Accordingly, XOR gate 212 may be programmed to cause an interrupt if the sense voltage is above or below the DAC voltage via the CPOL bit in the CHGCON register.

The output of XOR gate 212 provides the charge control signal (CCTRLA) to an external FET via pin 214 for controlling the charge current to the external battery.

In order to enable the charge control mode, a charge control function enable bit (CCAEN) of a charge/level detect control (CHGCON) register is set to a logic "1", otherwise pins 210 and 214 will assume their normal port I/O functions. The bits of the CHGCON register as shown in detail in FIG. 11. If bit CCAEN is a logic "1", the charge control circuit functions to make the current sense voltage appearing at the inverting terminal of comparator 50 equal to the programmable DAC output voltage appearing at the non-inverting input of comparator 50 thereby effectively controlling the amount of charging current seen by the battery. The status of the charge control comparator 50 (bit CCOMPA) as well as charge control polarity bit A (CPOLA) can also be read via the CHGCON register. The CHGCON register also includes the corresponding comparator and polarity bits (CCOMPB and CPOLB) associated with channel B.

Referring to FIG. 12, a detailed block diagram is shown illustrating the second charge control/level detector channel (Channel B) using a second DAC of block 48 as denoted by 201' in conjunction with comparator 51. Charge control Channel B is very similar to charge control Channel A of FIG. 8 wherein components shown in FIG. 12 that are identical to components shown in FIG. 8 are identified by prime reference numbers. The inputs of comparator 51 of channel B, however, are reversed with respect to comparator 50 of FIG. 8 whereby the inverting input of comparator 51 is coupled to the output of DAC 201' while the non-inverting input of comparator 51 receives the voltage via the zeroing circuit corresponding to sensed battery current (BATI). Also, the voltage supplied at the output of DAC 201' is controlled by the 8-bits of a DAC B (LDACB) register in a similar manner as the LDACA register controlled the current at the output of DAC 201 and according to the tables shown in FIGS. 9 and 10.

As mentioned earlier, the dual charge controller/level detectors may also be used to detect when an input signal exceeds or falls below a programmable threshold level. The level detectors may be used even though charge control is not being performed. In such a case, the charge control enable bit (CCAEN) of the CHGCON register would remain at a logic "0". Referring back to channel A of FIG. 8, the programmable threshold level is digitally set by programming the desired voltage output for DAC 201 via the LDACA register. This means that a predetermined programmable threshold voltage is applied to the non-inverting input of comparator 50 such that when the signal appearing at the inverting input of comparator 50 exceeds the programmable threshold voltage, comparator 50 switches logic states. This logic change may then be used to set a flag and cause an interrupt to microprocessor core 12 thereby calling for immediate action to be taken. Moreover, the logic state of the output of comparator 50 may be monitored by reading the CHGCON register (bit 2), as discussed above.

Wake-Up Function With Digitally Programmable Threshold

Microcontroller 10 includes a sleep mode that is entered by the execution of a specific sleep instruction. In the sleep mode, the on-chip oscillators are turned off but the watchdog timer continues to run. Moreover, microcontroller 10 includes a hibernate mode that is identical to the sleep mode except the watchdog timer is turned off. These modes result in low power consumption when the oscillators are disabled and yield substantial power savings.

Microcontroller 10 will exit or "wake-up" from the sleep mode in response to the occurrence of several events such as an external reset input, the timing out of the watchdog timer (if enabled), the detection of a start/stop bit at the I²C serial lines, or when an A/D conversion is complete. Additionally, if microcontroller 10 is used in a battery monitoring and charging application, the level detectors may be used to detect when a sensed battery current exceeds or falls below a programmable threshold level for waking up microprocessor core 12. With reference again to FIG. 8, when the sensed voltage, which is a voltage representing the sensed current of a battery (BATI), exceeds the programmable threshold voltage set by DAC 201, comparator 50 switches from a logic high to a logic low, thereby setting a wake-up interrupt flag (WUIF) and causing an interrupt to microcontroller core 12. Accordingly, the microprocessor core can be immediately brought out of the sleep mode and the increased current output from the battery can be adequately monitored for true, accurate and timely gauging of the battery level.

In a similar manner as described above, the level detector of channel B (of FIG. 12) can be used as an independent level detector to detect when another input signal exceeds or falls below a digitally programmable threshold level. For example, when the voltage via the zeroing circuit exceeds the programmable threshold voltage set by DAC 201', comparator 51 switches from a logic low to a logic high, thereby setting a wake-up interrupt flag (WUIF) and causing an interrupt to microcontroller core 12.

Alternately, by programming the two DACs to detect opposite polarities, a window detector may be implemented wherein both positive battery current flow exceeding a programmable threshold and negative battery current flow falling below a programmable threshold can cause an interrupt to the microprocessor core whereby logic bits CCOMPA and CCOMPB representing the outputs of comparators 50 and 51, respectively, may be read to determine which of the two detectors caused the interrupt. Such a window detector is useful in battery applications for detecting when the battery that is currently not in use is subsequently placed in a device, such as a camcorder, that draws/discharges current from the battery current or placed in a battery charger that supplies a charging current to the battery. In both situations, it is imperative to immediately wake-up the microprocessor core to detect such current flow for true and accurate gauging of the battery power. Inter-Integrated Circuit ($I^2C$) Interface Microcontroller 10 supports a bi-directional two wire bus and data transmission protocol. In particular, $I^2C$ interface 58 is a serial interface useful for communicating with other peripheral or microcontroller devices such as serial EEPROMs, shift registers, display drivers, A/D converters. Moreover, $I^2C$ interface 58 is compatible with the inter-integrated circuit ($I^2C$) specifications, the system management bus (SMBUS) and the access bus.

$I^2C$ bus is a two-wire serial interface developed by Philips/Signetics. The original specification, or standard mode, was designed for data transfers for up to 100 kilobits per second (Kbps) while an enhanced specification, or fast mode, supports data transmission of up to 400 Kbps wherein both standard and fast mode devices will inter-operate if attached to the same bus.

The $I^2C$ interface employs a comprehensive protocol to insure reliable transmissions and reception of data. When transmitting data, one device is the master and generates the clock signal while the other device(s) acts as the slave. Each device in the $I^2C$ interface protocol has a specific address associated therewith such that when a master wishes to initiate a data transfer, it first transmits the address of the device it wishes to talk to and if the address sent by the master matches the address of a slave device, then that slave device is selected for data transfer.

Figure 13:
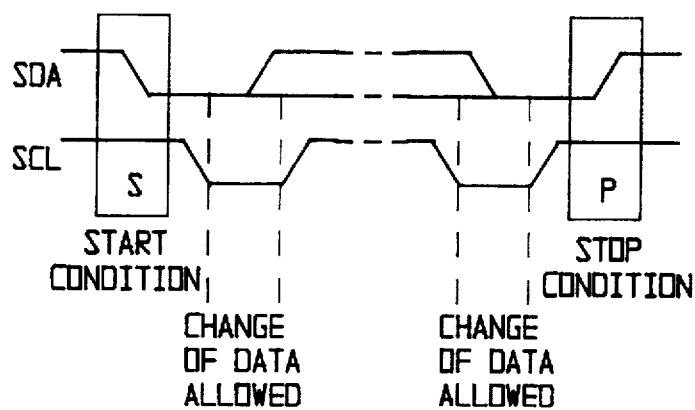
FIG. 13 is a graphical diagram illustrating start and stop conditions according to the I²C protocol.

During times of no data transfer, both the clock line (SCLA) and the data line (SDAA) are pulled high through external pull-up resistors. To accomplish data transmission, the master device generates both start and stop conditions to determine the start and stop of data transmission. Referring to FIG. 13, a start condition is defined as a low to high transition on the data line when the clock line is high, while the stop condition is defined as a low to high transition of the data line when the clock line is high. Moreover, because of the definition of the start and stop conditions, when the data is being transmitted, the data line can only change when the clock line is low as shown in FIG. 13.

Figure 14:
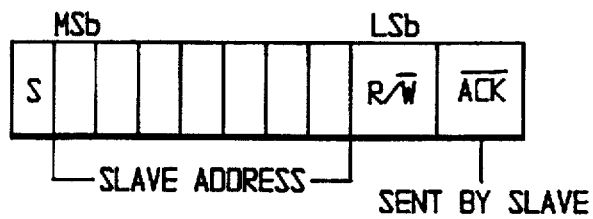

Two addressing formats exists for addressing $I^2C$ devices. The first is a 7-bit address format with a read/write bit as shown in FIG. 14. Briefly, after the start bit (S), 8 bits are generated by the master where the first seven bits are the address of the slave device and the last bit is a read/write bit.

The second addressing format is a 10-bit address format with a read/write bit as shown in FIG. 15. Briefly, after the start bit, two bytes must be generated by the master with the first five bits of the first byte specifying the address to be a 10-bit address. The next ten bits are the address of the slave device and the last bit is a read/write bit.

After each byte of transmitted data, the slave/receiver device generates an acknowledge bit. Referring to FIG. 16, a graphical diagram illustrating the generation of an acknowledge by a slave device is shown. In particular, the slave device acknowledges the receipt of the last byte of data by holding its data output line low during the clock pulse for acknowledgement. For example, for a 7-bit address format, every ninth clock pulse corresponds to an acknowledgement clock pulse.

Referring to FIG. 17, a graphical diagram illustrating an example of $I^2C$ data transfer using the 7-bit address format is shown. Briefly, after the start bit (S), the master generates the 7-bit address of the slave device as well as a read/write bit. Assuming the address was received, the slave device pulls its data output low and acknowledges receipt of the address. The master then generates a byte of data the receipt of which is acknowledged by the slave device. When data transfer is completed, the master generates a stop bit (P).

Figure 18:
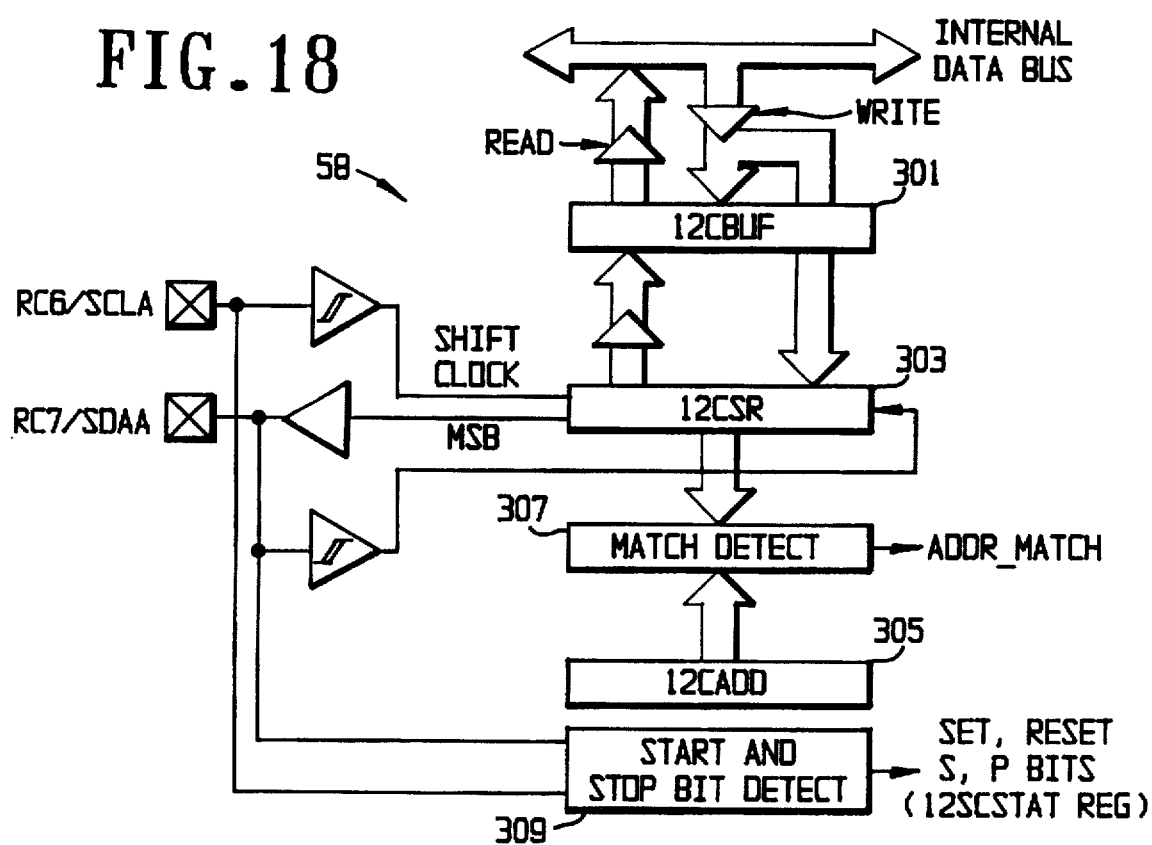
FIG. 18 is a detailed block diagram illustrating the I²C interface of FIG. 2.

Referring now to FIG. 18, a detailed block diagram of $I^2C$ interface 58 is shown. $I^2C$ interface 58 fully implements all slave functions and provides support in hardware to facilitate software implementations of the master functions. $I^2C$ interface implements the standard and fast mode specifications as well as both 7-bit and 10-bit addressing.

Two lines/external pins are used for data transfer: the RC6/SCLA pin, which is the $I^2C$ clock, and the RC7/SDAA pin, which acts as the $I^2C$ data.

$I^2C$ interface 58 has 5 registers for $I^2C$ operation: (1) an $I^2C$ control ($I^2CCON$) register, (2) the $I^2C$ status ($I^2CSTAT$) register, both of which are located in file register (data) space, (3) the serial receive/transmit buffer ($I^2CBUF$) 301, (4) an $I^2C$ shift register ($I^2CSR$) 303, and (5) an address ($I^2C$ ADD) register 305. Also included in $I^2C$ interface 58 are comparator/match detector 307 and start and stop bit detect circuitry 309.

The $I^2CCON$ register controls the $I^2C$ operation and allows one of the following $I^2C$ modes to be selected: 1) $I^2C$ slave mode with 7-bit addressing; 2) $I^2C$ slave mode with 10-bit addressing; 3) $I^2C$ slave mode with 7-bit addressing and with master mode support; 4) $I^2C$ slave mode with 10-bit addressing with master mode support; and 5) $I^2C$ master mode, where slave is idle.

The $I^2CSTAT$ register is read only and gives the status of the data transfer. This includes information such as the detection of a start or stop bit, if the received byte was data or address, if the next byte is the completion of a 10-bit address, and if this will be a read or a write data transfer.

The $I^2CBUF$ register is the register/buffer to which transfer data is written to or read from. The $I^2CSR$ register shifts the data into or out of microcontroller 10. The $I^2CADD$ register stores the address of the slave.

Figure 19:
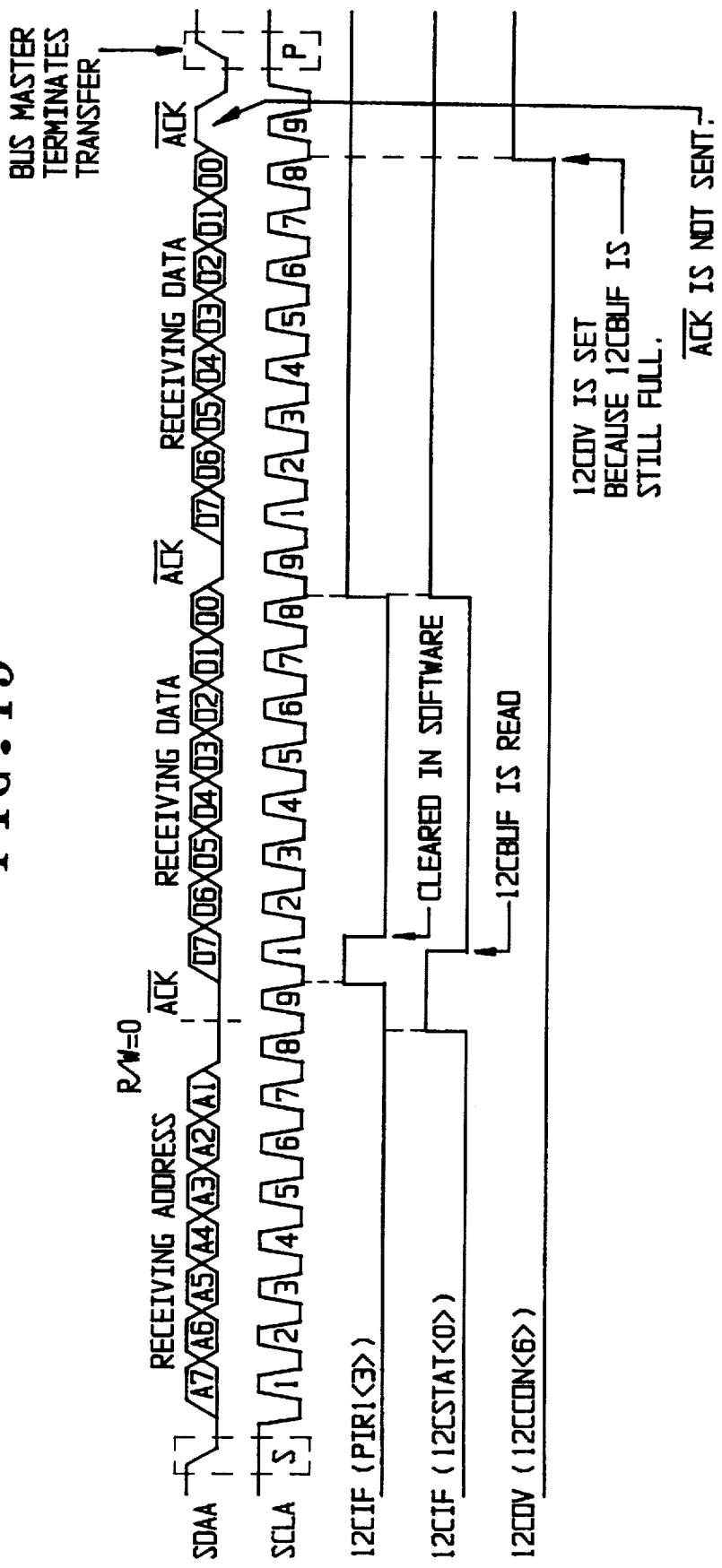
FIG. 19 is a graphical diagram illustrating typical waveforms associated with the I²C interface for the reception of data.

Referring to FIG. 19, a graphical diagram illustrating typical waveforms associated with $I^2C$ interface 58 for the reception of data and with a 7-bit address format is shown. Once the $I^2C$ interface 58 has been enabled, the interface waits for a start condition to occur. Following the start condition, the 7-bits of address as well as the read/write bit are shifted into I²CSR register 303. All incoming bits are sampled on the rising edge of the serial clock line. The contents of the I²CSR register is compared to the contents of the I²CADD register on the falling edge of the 8th clock pulse. If the addresses match, the contents of the I²CSR register is loaded into the I²CBUF register and the read/write bit of the I2CSTAT register is cleared (to denote that data is being written to interface 58) Also, an acknowledge pulse is generated and a I²C interrupt bit (I2CIF) is set after transfer of each data byte wherein the interrupt bit must be cleared in software and the I2CSTAT register is used to determine the status of the byte. However, if the I²CBUF register has not been read from the previous reception, an address byte overflow condition exists. In such a situation, no acknowledge pulse is generated and an overflow condition is denoted by setting an overflow bit (I2COV) in the I2CCON register.

Figure 20:
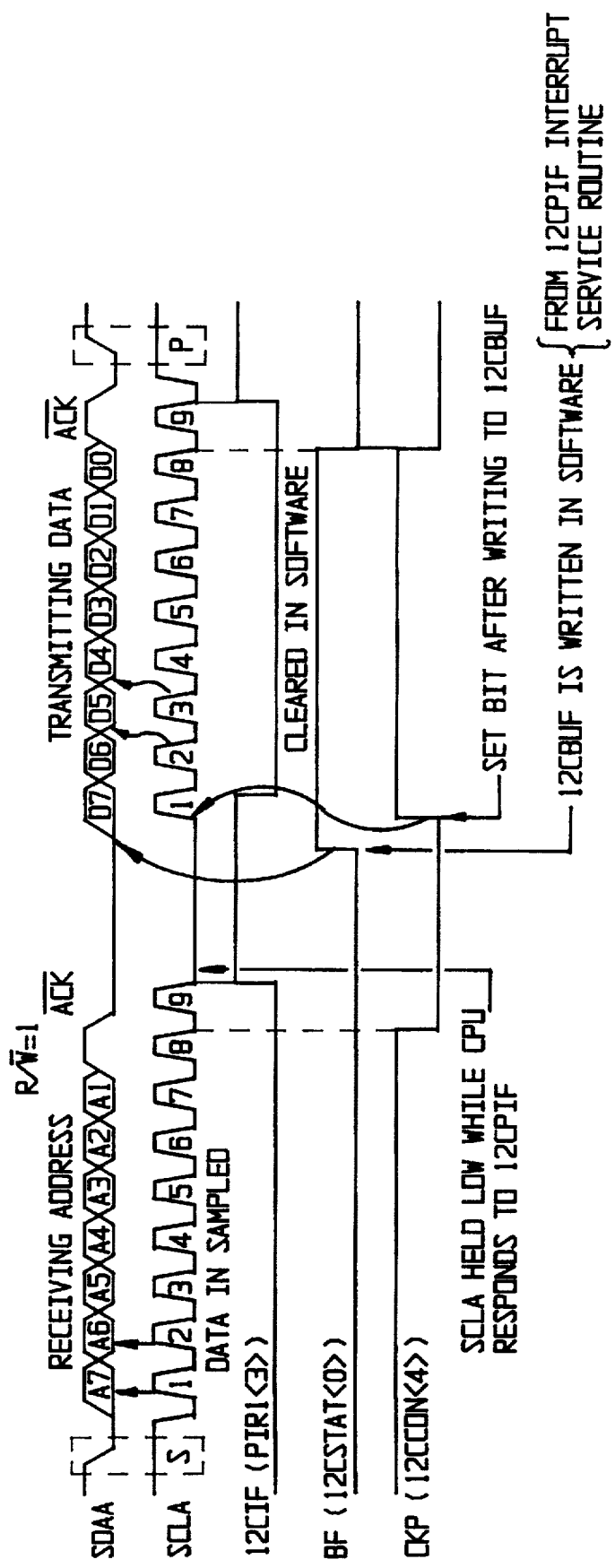
FIG. 20 is a graphical diagram illustrating typical waveforms associated with the I²C interface for the transmission of data.

Referring to FIG. 20, a graphical diagram illustrating typical waveforms associated with I²C interface 58 for the transmission of data and with a 7-bit address format is shown. When an address match occurs and the read/write bit of the address byte is set (to denote that data is being written to interface 58), the read/write bit of the I²CSTAT register is also set. The received address is loaded into the I²CBUF register and the acknowledge pulse will be generated on the ninth clock pulse. The data to be transmitted must be loaded into the I²CBUF register which also loads the I²CSR register. The 8 bits of data are shifted out on the falling edge of the serial clock line. Similar to reception of data, an I²C interrupt flag (I2CIF) is generated for each data transfer byte wherein the I²CIF bit must be cleared in software and I²CSTAT register is used to determine the status of the byte.

In-Circuit Programming of the Microcontroller

By making use of the I²C interface 58, microcontroller 10 can be serially programmed while in the end application circuit. Such a feature allows customers to manufacture boards with un-programmed devices and then program the microcontroller just before shipping the product. This allows the most recent firmware or a custom firmware to be programmed.

Microcontroller 10 can be placed in a program/verify mode by holding the serial clock and serial data pins low while raising the voltage programming pin to voltage $V_{pp}$, for example, 12 volts with respect to $V_{ss}$. Once in the program mode, the user program memory, as well as the test program memory, can be accessed and programmed in either a serial or parallel fashion whereby the initial mode of operation is serial and the memory that is accessed is the user program memory.

Figure 21:
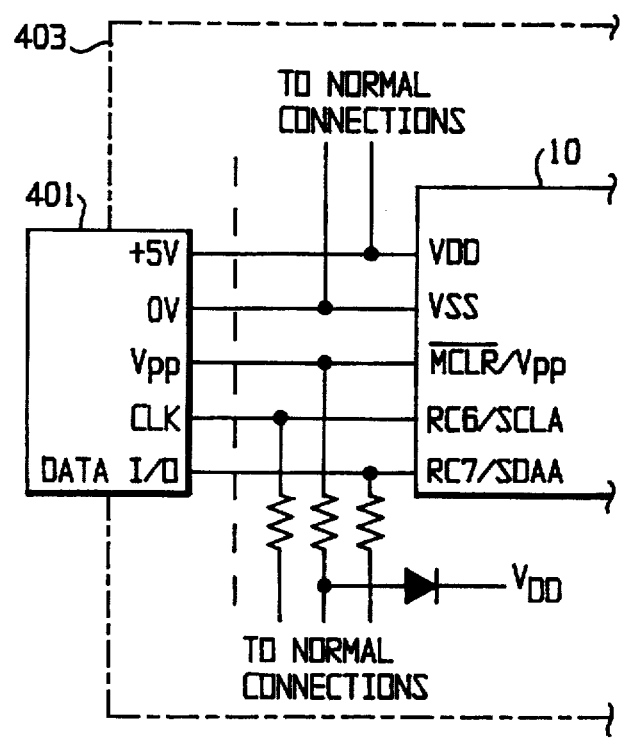
FIG. 21 is a block diagram illustrating a typical in-circuit serial programming connection of the microcontroller of FIG. 1.

The present invention accomplishes in-circuit serial programming by utilizing two external pins of microcontroller 10 (the SCLA and SDAA pins) for providing clock and data to and from microcontroller 10. Additionally, three other pins are utilized for providing power, ground and a programming voltage (Vpp) to microcontroller 10 when performing in-circuit programming. Referring to FIG. 21, a typical in-circuit serial programming configuration of microcontroller 10 is shown. For exemplary purposes only, microcontroller 10 of FIG. 21 reside inside end-circuit/battery pack 403 for use in controlling the charging monitoring of a battery (not shown in FIG. 21). FIG. 21 illustrates a portion of microcontroller 10 including a portion of its external pins for coupling to external connector 401 of battery pack 403 for use in programming microcontroller 10 when microcontroller 10 is already incorporated in battery pack 403. External connector 401 receives external signals for supplying clock and serial data signals to the SCLA and SDAA pins, respectively, of microcontroller 10. The clock pin is used for applying a clock to the microcontroller while the data pin is used for entering command bits and serially inputting and outputting data during serial operation. Connecter 401 also receives and supplies a programming voltage, for example, 12 volts, to the masterclear (MCLR)/voltage programming pin of microcontroller 10 for enabling microcontroller 10 to enter the serial programming mode. Finally, connector 401 supplies +5 volts and ground to external power pins $V_{DD}$ and $V_{ss}$, respectively, of microcontroller 10.

Referring to FIG. 22, a table is shown illustrating the different commands that are available for serial programming. The "load test" command is used for loading a 14-bit word into test program memory whereby upon receiving this command the program counter is set to a predetermined location in test program memory. The "load data" command is used for lading a 14-bit word into user program memory. The "read data" command is used for transmitting a 14-bit word out of user program memory. The "increment address" command, upon receipt, is used for incrementing the program counter of microcontroller 10. The "begin programming" command is used for commencing programming of either the test program memory or the user program memory whereby a load test or a load data command must be given prior to the begin programming command. The "enter parallel mode" command is used for programming microcontroller 10 to accept data in a parallel mode. The parallel mode is generally not applicable for in-circuit programming of the microcontroller since a battery pack typically has only a few external connectors. Finally, the "end programming" command is used to stop programming of the program memory.

Figure 23:
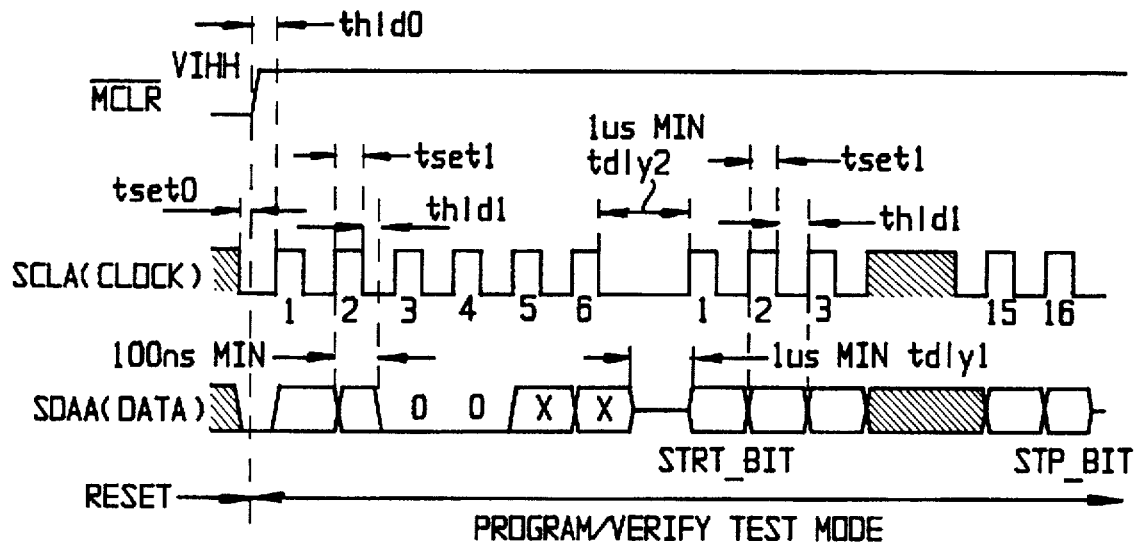
FIGS. 23 and 24 are graphical diagrams illustrating the load data and read data commands, respectively, for serial program operation.
Figure 24:
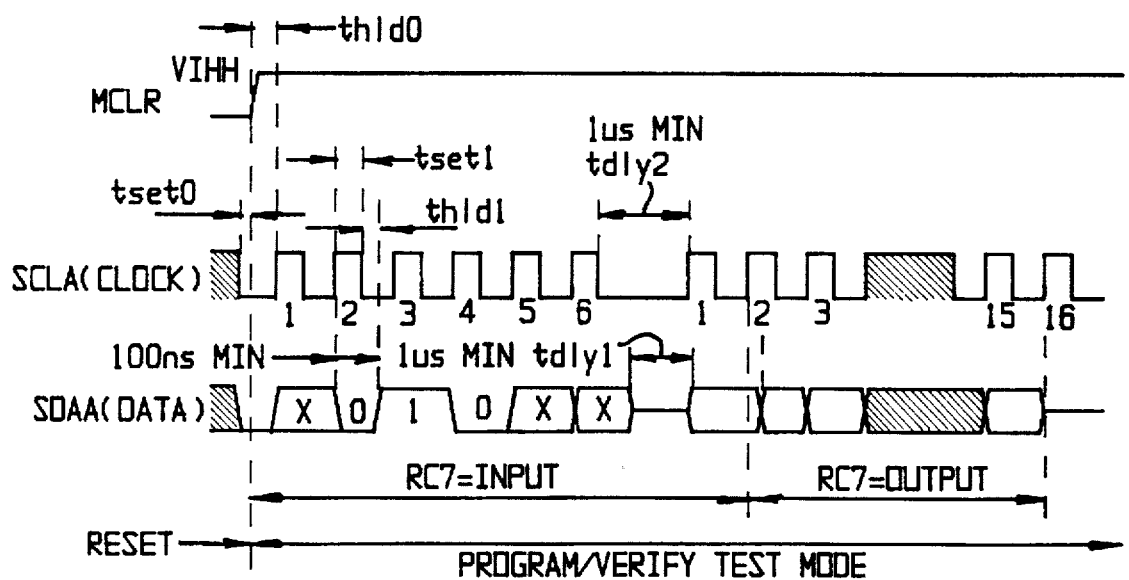

Referring to FIGS. 23 and 24, graphical diagrams illustrating the load data and read data commands, respectively, for serial program operation is shown. In order to input a command, the clock pin is cycled 6 times whereby each command bit is latched on the falling edge of the clock with the least significant bit (LSB) of the command being input first. The data on the SDAA pin is required to have a minimum set-up (tset0, tset1) and hold time (thld0, thld1) of, for example, 100 nanoseconds, with respect to the falling edge of the clock as shown in FIGS. 23 and 24. Moreover, commands that have data associated with them, such as the read data and load data commands, are specified to have a minimum delay (tdly1) of, for example, 1 microsecond, between the command and the data as shown in FIGS. 23 and 24. After this delay, the clock pin is cycled 16 times with the first cycle being a start bit and the last cycle being a stop bit and data being input or output with the middle 14 clock cycles with the least significant bit being first. In particular, during a read operation, the least significant bit will be transmitted onto the SDAA pin on the rising edge of the second cycle, while during a load operation the least significant bit will be latched on the falling edge of the second cycle.

In summary, the present invention provides in-circuit, serial programming of microcontroller 10. This allows the end user to program microcontroller 10 when already placed in an end-use application, such as in a battery pack for use in battery charging and battery monitoring control.

Battery Monitoring Application

Figure 25:
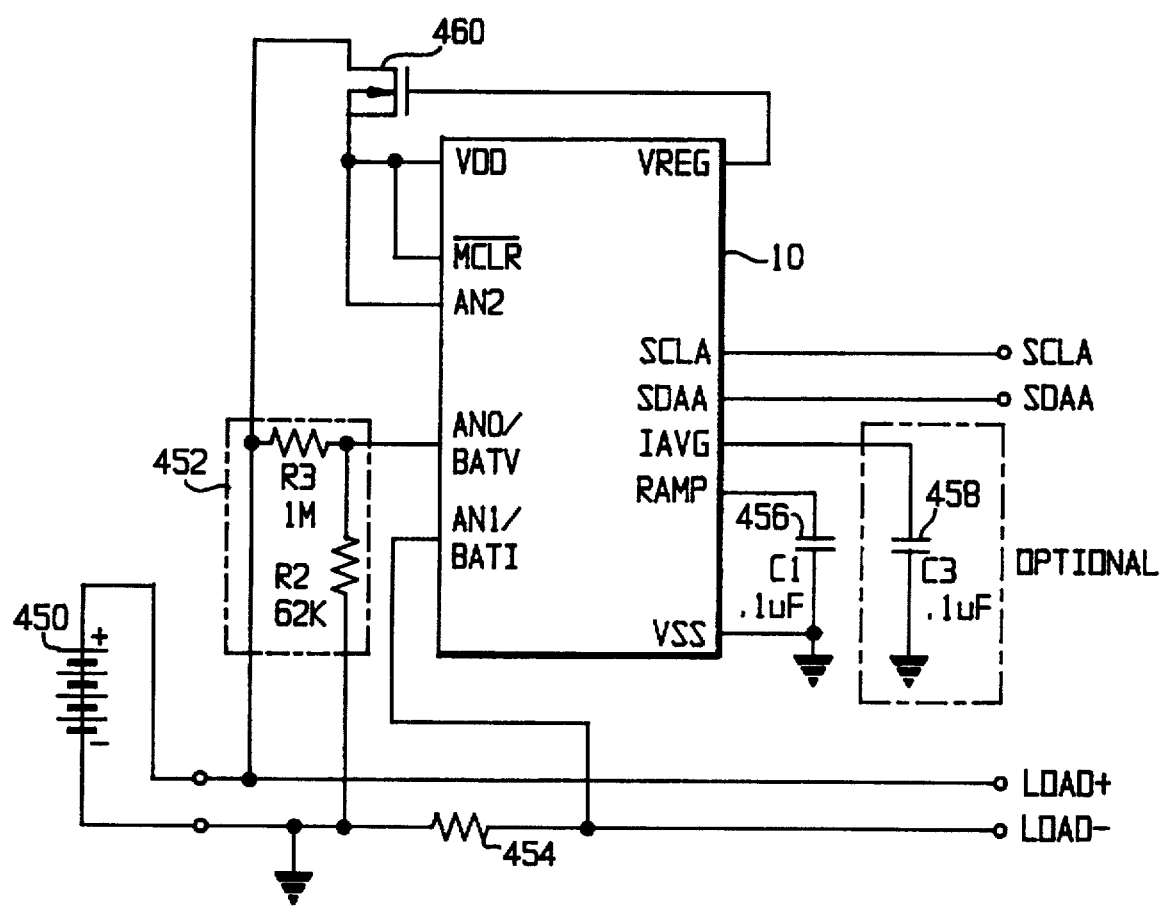
FIG. 25 is a block diagram illustrating the microcontroller of FIG. 1 configured for use in monitoring an external battery.

Referring to FIG. 25, a block diagram is shown illustrating microcontroller 10 configured in an application for use in monitoring external battery 450. The voltage of battery 450 is coupled through voltage divider circuit 452 and supplied to the AN0/BATV analog input of microcontroller 10. The current of battery 450 passes through sense resistor 454 and supplies a voltage indicative of battery current to the AN1/BATI analog input of microcontroller 10. The RAMP pin of microcontroller 10 is coupled through an external capacitor 456 and returned to ground for generating a programmable ramp voltage there across. The IAVG pin of microcontroller 10 is optionally coupled through external capacitor 458 and returned to ground for use in capturing small duration current pulses as previously discussed. The voltage regulator pin (VREG) is coupled to the gate electrode of external N-channel FET 460 for providing voltage regulation. The drain electrode of FET 460 is coupled to receive the battery voltage while the source electrode of FET 460 provides a regulated voltage $V_{DD}$ to microcontroller 10. Further, the regulated voltage can be measured via external analog input AN2.

Although certain preferred embodiments and methods have been disclosed herein, it will be apparent to those skilled in the art from consideration of the foregoing description that variations and modifications of the described embodiments and methods may be made without departing from the true spirit and scope of the invention. Accordingly, it is intended that the invention shall be limited only to the extent required by the appended claims and the rules and principles of applicable law.

We claim:

1. A method for increasing the precision of measurements made by a microcontroller by digital trimming of analog components of the microcontroller, the microcontroller being fabricated on a semiconductor chip to execute programs and instructions and to generate control signals as a result of execution by the microcontroller of programs and instructions for selectively controlling an external controllable system, the microcontroller including microprocessor means for executing instructions, program memory means for storing programs to be executed by the microcontroller and data memory means for storing data, the microcontroller also including a plurality of analog components for use in measuring a plurality of mixed analog input signals, the method comprising the steps of measuring parameters associated with at least some of the plurality of analog components, including the step of obtaining digital representations of said measured parameters;

obtaining respective calibration constants in response to said measured parameters;

storing said calibration constants in the program memory of the microcontroller;

sampling selected ones of the plurality of analog input signals at different sampling rates depending upon variation of signal amplitude, including the step of obtaining digital representations of the selected analog input signals; and using said calibration constants in conjunction with said sampled analog input signals to digitally trim the analog components to increase the precision of measurements made by the analog components, whereby obtain more precise values of the selected analog input signals.

2. The method of claim 1 including the step of filtering the digital representations of said selected analog input signals before use thereof in conjunction with said calibration constants.

3. The method of claim 2 wherein the selected mixed analog input signals correspond to operating parameters of an external battery.

4. The method of claim 3 wherein at least one of the selected mixed analog input signals corresponds to output voltage of said external battery.

5. The method of claim 3 wherein at least one of the selected mixed analog input signals corresponds to output current of said external battery.

6. The method of claim 3 wherein at least one of the selected mixed analog input signals corresponds to operating temperature of said external battery.

7. A microcontroller for battery charging and battery monitoring applications, the microcontroller being fabricated on a semiconductor chip to execute programs and instructions and to generate control signals as a result of said execution of the programs and instructions for selectively controlling an external controllable system, the microcontroller including microprocessor means for executing instructions, program memory means for storing programs to be executed by the microcontroller and data memory means for storing data, the microcontroller also including a plurality of analog components for use in measuring a plurality of analog input signals from an external battery, the microcontroller comprising:

means for measuring parameters of at least some of the plurality of analog components, including means for deriving digital representations of the measured parameters;

means for obtaining calibration constants associated with at least some of the plurality of analog components;

means for storing said calibration constants;

means for sampling selected ones of the plurality of analog input signals at sampling rates that depend on the variation of signal level of the selected signals, including means for developing digital representations of the respective sampled signals; and means responsive to said calibration constants and the digital representations of the sampled analog input signals for digitally trimming the digital representations of the measured parameters of said at least some of the analog components to enhance the precision of the measurements of said selected analog input signals.

8. The microcontroller of claim 7 wherein at least one of the analog input signals selected for sampling corresponds to output voltage of said external battery.

9. The microcontroller of claim 7 wherein at least one of the analog input signals selected for sampling corresponds to output current of said external battery.

10. The microcontroller of claim 7 wherein at least one of the analog input signals selected for sampling corresponds to operating temperature of said external battery.

11. The microcontroller of claim 7 wherein the means for developing digital representations of the respective sampled signals includes a slope analog-to-digital converter.

12. A method of trimming the value of an electrical parameter of analog circuitry within a semiconductor integrated circuit (IC) chip used at least in part for signal processing, by accumulating and storing calibration data for use in compensating for effect of variations in IC chip fabrication process technology, temperature and other manufacturing and ambient factors, and to be made available to chip users for IC chip calibration, said method comprising the steps of:

measuring, during manufacturer final test of the IC chip, values of electrical parameters selected for availability to the chip user as calibration values, and providing an analog representation of each measured parameter;

converting each analog measurement parameter to a digital calibration value indicative of characterization data for the respective parameter; and storing each said digital calibration value for the respective parameter in write-protected reserved space of on-chip memory for the IC chip, to be selectively accessed by the chip user.

13. The method of claim 12, wherein the electrical parameters for which calibration data is to be obtained by initial measurement of analog values includes selected voltage and current values, and further including the step of bringing the selected voltages and currents out to a predetermined pin of the IC chip before measuring the values thereof.

14. The method of claim 12 wherein said selective access to the stored values is performed by the chip user to allow compensation for drift of respective components of the analog circuitry.

15. Apparatus for trimming the value of an electrical parameter of analog circuitry within a semiconductor integrated circuit (IC) chip used at least in part for signal processing, by accumulating and storing calibration data for use in compensating for effect of variations in IC chip fabrication process technology, temperature and other manufacturing and ambient factors, and to be made available to chip users for IC chip calibration, comprising:

means for measuring values of electrical parameters selected for availability to the chip user as calibration values and providing an analog representation of each measured parameter;

means responsive to said measuring means for converting each analog measurement parameter to a digital calibration value indicative of characterization data for the respective parameter; and on-chip memory means responsive to the analog-to-digital conversion for storing each said digital calibration value for the respective parameter in write-protected reserved space, for selective access by the chip user.

16. The apparatus of claim 15, wherein the electrical parameters for which calibration data is to be obtained by initial measurement of analog values includes selected voltage and current values, and further including circuit means for bringing the selected voltages and currents out to a predetermined pin of the IC chip, for measuring the values thereof at said pin.

17. The apparatus of claim 15, including means for obtaining said selective access to the stored values to allow compensation for drift of respective components of the analog circuitry.

18. The method of claim 12 wherein said electrical parameters include voltages, currents and oscillation frequency.

* * * * *